(12) United States Patent
Nakagame et al.

(10) Patent No.: US 8,133,533 B2
(45) Date of Patent: *Mar. 13, 2012

(54) METHOD FOR PRODUCING FUNCTIONAL FILM

(75) Inventors: Masami Nakagame, Odawara (JP); Hiroyuki Nishida, Odawara (JP); Norihiro Kadota, Odawara (JP); Jun Fujinawa, Odawara (JP)

(73) Assignee: Fujifilm Corporation, Tokyo (JP)

( * ) Notice: Subject to any disclaimer, the term of this patent is extended or adjusted under 35 U.S.C. 154(b) by 409 days.

This patent is subject to a terminal disclaimer.

(21) Appl. No.: 12/363,435

(22) Filed: Jan. 30, 2009

(65) Prior Publication Data

US 2009/0196998 A1    Aug. 6, 2009

(30) Foreign Application Priority Data

Jan. 31, 2008  (JP) ................................. 2008-020187

(51) Int. Cl.
  *B05D 3/12* (2006.01)
(52) U.S. Cl. ................. 427/255.31; 427/255.6; 427/355; 427/358; 427/359; 427/365
(58) Field of Classification Search ............. 427/255.31, 427/255.6, 355, 358, 359, 365
See application file for complete search history.

(56) References Cited

U.S. PATENT DOCUMENTS

| | | | | |
|---|---|---|---|---|
| 5,736,209 | A * | 4/1998 | Andersen et al. ............ | 428/36.4 |
| 5,790,926 | A * | 8/1998 | Mizoe et al. .................. | 399/174 |
| 6,495,204 | B1 * | 12/2002 | Allen et al. .................. | 427/220 |
| 6,522,067 | B1 * | 2/2003 | Graff et al. ................... | 313/512 |
| 7,291,397 | B2 * | 11/2007 | Miyadera et al. ............. | 428/426 |
| 7,342,356 | B2 * | 3/2008 | McCormick et al. ......... | 313/512 |
| 7,486,017 | B2 * | 2/2009 | Ohkubo ........................ | 313/506 |
| 2002/0053123 | A1 | 5/2002 | Sanda et al. | |
| 2002/0085191 | A1 * | 7/2002 | Mimura et al. ................ | 355/71 |
| 2002/0146559 | A1 * | 10/2002 | Touhsaent ..................... | 428/341 |
| 2004/0159335 | A1 * | 8/2004 | Montierth et al. ............. | 134/10 |
| 2004/0213918 | A1 | 10/2004 | Mikhael et al. | |
| 2005/0139783 | A1 * | 6/2005 | Kubota et al. ............... | 250/484.4 |
| 2007/0182777 | A1 * | 8/2007 | Vaeth et al. ..................... | 347/20 |
| 2010/0151209 | A1 * | 6/2010 | Wei et al. ..................... | 428/189 |
| 2010/0159158 | A1 * | 6/2010 | Shibata et al. ................ | 428/1.1 |

FOREIGN PATENT DOCUMENTS

| | | |
|---|---|---|
| JP | 60-104313 | 6/1985 |
| JP | 02-297412 | 12/1990 |
| JP | 04-152553 A | 5/1992 |
| JP | 06-017250 | 1/1994 |
| JP | 08-134645 | 5/1996 |
| JP | 11-011760 A | 1/1999 |
| JP | 11-193460 | 7/1999 |
| JP | 2002-264274 A | 9/2002 |
| JP | 2003-105596 * | 4/2003 |
| WO | 00/62943 A1 | 10/2000 |

OTHER PUBLICATIONS

Graff, G.L., et al., "Mechanisms of vapor permeation through multilayer barrier films: Lag time versus equilibrium permeation." Journal of Applied Physics, vol. 96, No. 4, Aug. 15, 2004, pp. 1840-1849.*

Charton, C., et al., "Development of high barrier films on flexible polymer substrates". Thin Solid Films, 502 (2006) pp. 99-103.*

Kurosawa, Shigeru, et al., "Detection of deposition rate of plasma-polymerized acrylate and methacrylate derivatives using quartz crystal microbalance". Thin Solid Films 457 (2004) 26-33.*

Alf, Mahriah, et al., "Chemical Vapor Deposition of Conformal, Functional, and Responsive Polymer Films". Advanced Materials, 2010, 22, 1993-2027.*

JP Notification of Reasons for Refusal, dated Mar. 23, 2010, issued in corresponding JP Application No. 2008-020187, 3 pages with partial English translation.

EP Communication, dated Jun. 5, 2009, issued in corresponding EP Application No. 09001291.5, 7 pages.

\* cited by examiner

*Primary Examiner* — Bret Chen
(74) *Attorney, Agent, or Firm* — Sughrue Mion, PLLC

(57) ABSTRACT

The method for producing a functional film includes a step of forming an organic film on a surface of a substrate and a step of forming an inorganic film by vacuum deposition on a surface of the organic film to produce the functional film. Prior to forming the inorganic film, a member contacts the surface of the organic film in a vacuum chamber at portions where the organic film does not exhibit its functions.

7 Claims, 2 Drawing Sheets

METHOD FOR PRODUCING FUNCTIONAL FILM

The entire contents of literatures cited in this specification are incorporated herein by reference.

BACKGROUND OF THE INVENTION

This invention relates to a method for producing a functional film. More specifically, this invention relates to a method for producing a functional film having an organic film comprising a particular polymer and an inorganic film.

Various functional films (functional sheets) including gas barrier films, protective films, and optical films such as optical filters and antireflection films are used in various devices including optical devices, display devices such as liquid crystal displays and organic EL displays, semiconductor devices, and thin film solar batteries.

The functional films have been formed by film formation (thin film formation) through vacuum deposition techniques such as sputtering and plasma CVD.

Continuous deposition of a film on a long strip of substrate is preferable for efficient film formation with high productivity.

A typical device known in the art for conducting such film formation is a roll-to-roll film formation device using a feed roll having a long strip of substrate (a web of substrate) wound into a roll and a take-up roll in which the substrate having a film formed thereon is wound into a roll. This roll-to-roll film formation device continuously forms a film on a long strip of substrate in the film formation chamber while conveying the substrate from the feed roll to the take-up roll along a predetermined pathway passing through the film formation chamber where the film is formed on the substrate by plasma CVD. In this device, the substrate is fed from the feed roll in synchronism with the winding of the substrate having the film formed thereon on the take-up roll.

By the way, a functional film such as a gas barrier film or a protective film is not always a mono-layer film, and a typical functional film known in the art is the one prepared by forming an organic film containing a polymer as its main component on a substrate such as a plastic film, and thereafter forming an inorganic film comprising an inorganic compound on the organic film.

For example, JP 2002-264274 A discloses a gas barrier film prepared by forming an organic film comprising a cured composition containing a monomer or an oligomer of a hexafunctional acrylate or methacrylate, and an inorganic film comprising an oxide selected from aluminum oxide, silicon oxide, a complex oxide of indium and tin, and a complex oxide of indium and cerium.

SUMMARY OF THE INVENTION

In the roll-to-roll film formation device as described above, a conveyor means such as a pair of conveyor rollers (nip rollers) are usually provided for adequately conveying the substrate along a predetermined pathway.

However, in the production of a functional film in which an inorganic film is deposited after forming an organic film of some particular type, the functional film exhibiting the desired performance such as sufficient gas barrier properties may become difficult to produce due to the loss of the performance or the properties of the organic film when a conventional type of the conveyor means such as a pair of conveyor rollers is used for the handling of the substrate.

The present invention has been made to solve the problems as described above, and an object of the present invention is to provide a method for producing a functional film, wherein an organic film containing a polymer as its main component is formed followed by the deposition of an inorganic film, and wherein the loss of the performance or properties of the organic film during the production is prevented to enable production of a high quality functional film in a consistent manner.

In order to achieve the object as described above, the present invention provides a method for producing a functional film, comprising the steps of: forming an organic film on a surface of a substrate; and forming an inorganic film by vacuum deposition on a surface of the organic film to produce the functional film, wherein, prior to forming the inorganic film, a member contacts the surface of the organic film in a vacuum chamber at portions where the organic film does not exhibit its functions.

In the functional film production method of the invention, the inorganic film formed preferably has gas barrier properties.

The member contacting the organic film in the vacuum chamber preferably comprises a stepped roller.

A nip roller for nipping the substrate with the stepped roller is preferably further used.

The member contacting the organic film in the vacuum chamber preferably comprises clips with which ends of the substrate in a direction perpendicular to a direction in which the substrate is conveyed are clipped to convey the substrate.

Preferably, perforations are formed at both ends of the substrate in a direction perpendicular to a direction in which the substrate is conveyed and the member contacting the organic film in the vacuum chamber comprises a sprocket engaging with the perforations.

In the present invention as summarized above, an organic film containing a polymer as its main component such as an organic film containing a polymer produced by polymerizing an acrylate monomer and/or a methacrylate monomer as its main component is formed on a substrate, and an inorganic film is thereafter formed to produce a functional film, and a member used in the vacuum chamber contacts the organic film at portions where the organic film does not exhibit its functions, for example at the ends (in the vicinities of the ends) in a direction of conveyance of the substrate. In other words, in the case where the substrate having the organic film formed thereon is treated in the vacuum chamber until the completion of the formation of the inorganic film, the member contacts the organic film only at portions where the organic film does not exhibit its functions, as exemplified by the ends of the organic film.

The production method of the present invention as summarized above is capable of preventing the properties and performance of the organic film from being deteriorated by the conveying (handling) of the substrate having the organic film formed thereon so that a highly functional film properly having the intended performance and properties can be consistently produced.

DETAILED DESCRIPTION OF THE INVENTION

Next, the method for producing a functional film according to the present invention is described in detail by referring to the preferred embodiments shown in the accompanying drawings.

Figure 1:
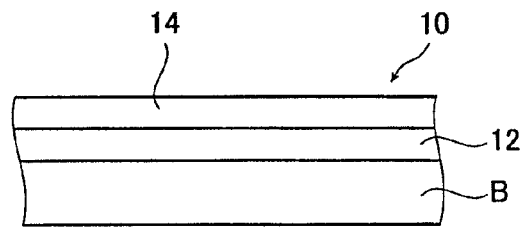
FIG. 1 is a schematic view showing a functional film produced by the functional film production method of the present invention.

FIG. 1 is a schematic view showing a functional film produced by the functional film production method of the present invention.

As shown in FIG. 1, the production method of the present invention involves depositing (forming) an organic film 12 containing a predetermined polymer as its main component on the surface of a substrate B and depositing an inorganic film 14 on the organic film 12 by vacuum deposition to thereby produce a functional film 10.

The production method of the invention produces the functional film 10 by using, for example, an organic film forming device 20 in which the organic film 12 is formed on the surface of the substrate B and an inorganic film forming device 22 in which the inorganic film 14 is formed on the surface of a substrate Bo having the organic film 12 formed on the substrate B (hereinafter referred to simply as the "substrate Bo").

Figure 2A:
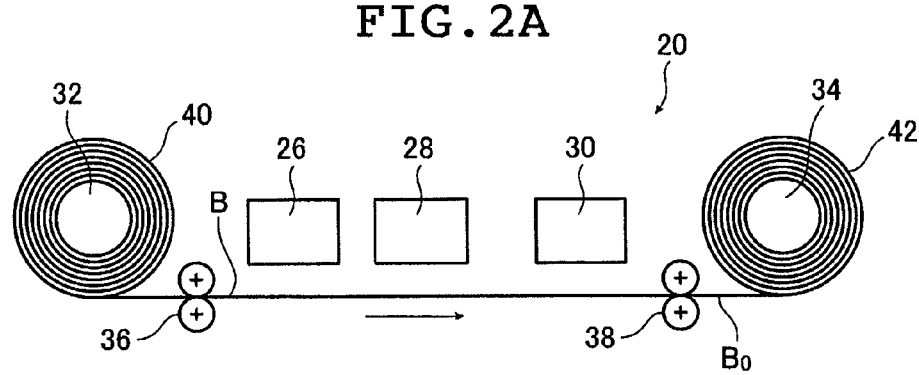
FIGS. 2A and 2B are schematic views showing an embodiment of the production device for implementing the functional film production method of the present invention.

FIG. 2A schematically shows an embodiment of the organic film forming device 20.

The organic film forming device 20 is a device in which the organic film 12 is formed on the surface of the substrate B by applying a coating composition containing a monomer mixture to be described below and drying the coating for polymerization to form the organic film 12 on the surface of the substrate B. In the illustrated embodiment, the organic film forming device 20 includes a coater means 26, a dryer means 28, a UV irradiator 30, a rotary shaft 32, a winding shaft 34, and conveyor roller pairs 36 and 38.

The organic film forming device 20 is a device in which film formation is carried out by a so-called "roll to roll" system. In this device, the substrate B in the form of a long film strip (the starting film material) is fed from a substrate roll 40 having the substrate B wound into a roll and conveyed in its longitudinal direction while the organic film 12 is formed on the substrate B, and the substrate Bo having the organic film 12 formed on the substrate B is wound into a roll.

In the organic film forming device 20, the substrate roll 40 having the substrate B in the form of a long film strip as described above is mounted on the rotary shaft 32.

Once the substrate roll 40 is mounted on the rotary shaft 32, the substrate B is conveyed along a predetermined pathway along which the substrate B travels from the substrate roll 40 through the conveyor roller pair 36, then underneath the coater means 26, the dryer means 28 and the UV irradiator 30, then through the conveyor roller pair 38 to reach the winding shaft 34. In the organic film forming device 20, the feed of the substrate B from the substrate roll 40 and the winding of the substrate Bo on the winding shaft 34 are carried out in synchronism so that the substrate B in the form of a long film strip is conveyed in its longitudinal direction along the predetermined pathway while the continuous formation of the organic film 12 on the substrate B is carried out.

In the present invention, the substrate B on which the organic film 12 and the inorganic film 14 are formed is not particularly limited, and any substrate (base film) used in preparing various functional films such as gas barrier films, optical films, and protective films may be used as long as formation of the organic film 12 and formation of the inorganic film 14 by vacuum deposition to be described later are possible. Examples of such substrate include resin films such as PET films and metal sheets such as aluminum sheets.

The substrate B used may be the one having a film such as a protective film or an adhesive film formed on its surface.

As described above, the organic film forming device 20 forms the organic film (organic layer) 12 containing a polymer as its main component on the surface of the substrate B.

More specifically, the organic film 12 is a film formed from a material selected from among thermoplastic resins such as polyester, acrylic resin, methacrylic resin (the acrylic resin and the methacrylic resin are also collectively referred to as "acrylate polymer"), methacrylic acid-maleic acid copolymer, polystyrene, transparent fluororesin, polyimide, fluorinated polyimide, polyamide, polyamideimide, polyetherimide, cellulose acylate, polyurethane, polyether ether ketone, polycarbonate, alicyclic polyolefin, polyallylate, polyethersulfone, polysulfone, polycarbonate modified with fluorene ring, polycarbonate modified with an alicycle, polyester modified with fluorene ring, and acryloyl compound; polysiloxane and organosilicon compounds.

The organic film 12 may comprise either a single material or a mixture of two or more materials, and it may also comprise two or more layers each comprising the same composition or different compositions. The organic film 12 may not necessarily have a clear boundary with the inorganic film, and the composition may gradually change in the thickness direction as disclosed in US 2004-46497 A.

Preferably, the organic film 12 has high surface smoothness as well as high hardness. The surface smoothness of the organic film 12 is preferably up to 10 nm, and more preferably up to 2 nm in terms of the mean roughness (Ra value) in an area of 10 μm square.

The organic film 12 may preferably have at least some degree of hardness. More specifically, the organic film 12 may preferably have an indentation hardness as measured by nanoindentation method of at least 100 N/mm$^2$, and more preferably at least 200 N/mm$^2$, and a pencil hardness of at least HB, and more preferably H.

The organic film 12 is not particularly limited for its thickness. However, when the organic film 12 is too thin, a uniform thickness will be difficult to achieve whereas an excessively thick film may result in the generation of cracks, and hence in the insufficient barrier properties upon application of external force. From these viewpoints, the thickness of the organic film 12 is preferably in the range of 10 nm to 2 μm, and more preferably from 100 nm to 1 μm.

The organic film 12 may be formed by the methods commonly used in the art such as solution coating and vacuum deposition.

Exemplary solution coating methods include dip coating, air knife coating, curtain coating, roller coating, wire-bar coating, gravure coating, slide coating, and extrusion coating using a hopper as described in U.S. Pat. No. 2,681,294. Alternatively, the organic layer may be formed by applying and curing a commercially available adhesive.

The method used in the vacuum deposition is not particularly limited, and preferable methods include vapor deposition and plasma CVD. Among these, most preferred is flash evaporation described in U.S. Pat. No. 4,842,893, U.S. Pat. No. 4,954,371, and U.S. Pat. No. 5,032,461. The flash evaporation is useful because it has the effect of reducing the oxygen dissolved in the monomer, which improves the degree of polymerization.

In the present invention, the polymer may be applied by solution coating or by applying a hybrid coating containing an inorganic compound as disclosed in JP 2000-323273 A or JP 2004-25732 A. Alternatively, the polymer layer may be formed by coating a precursor of the polymer (for example, a monomer) followed by polymerization.

Exemplary preferable monomers that may be used in forming the organic film 12 in the present invention include acrylates, methacrylates, and commercial available adhesives. More specifically, the organic film 12 of the present invention preferably contains as its main component a polymer produced by polymerizing an acrylate monomer and/or a methacrylate monomer having an ethylenically unsaturated bond. When an acrylate monomer and/or a methacrylate monomer is used for preventing the inconvenience in vacuum as described below, the monomer used may preferably have a molecular weight of up to 700, and more preferably 150 to 600.

Exemplary commercially available adhesives include Epo-Tek series available from Daizo Corporation, XNR-5000 series available from Nagase ChemteX Corporation, and 3000 series available from ThreeBond Co., Ltd.

Preferable acrylates and methacrylates include the compounds described in U.S. Pat. No. 6,083,628 and U.S. Pat. No. 6,214,422. Typical examples are as shown below.

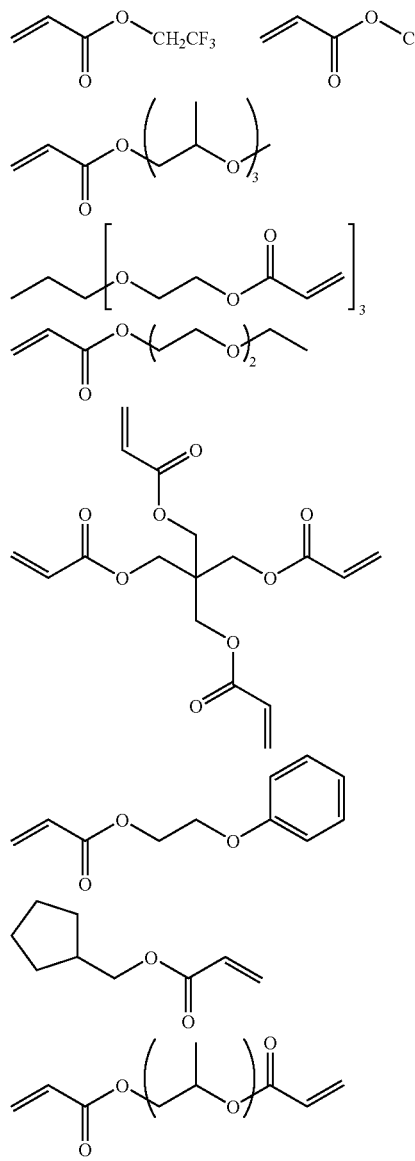
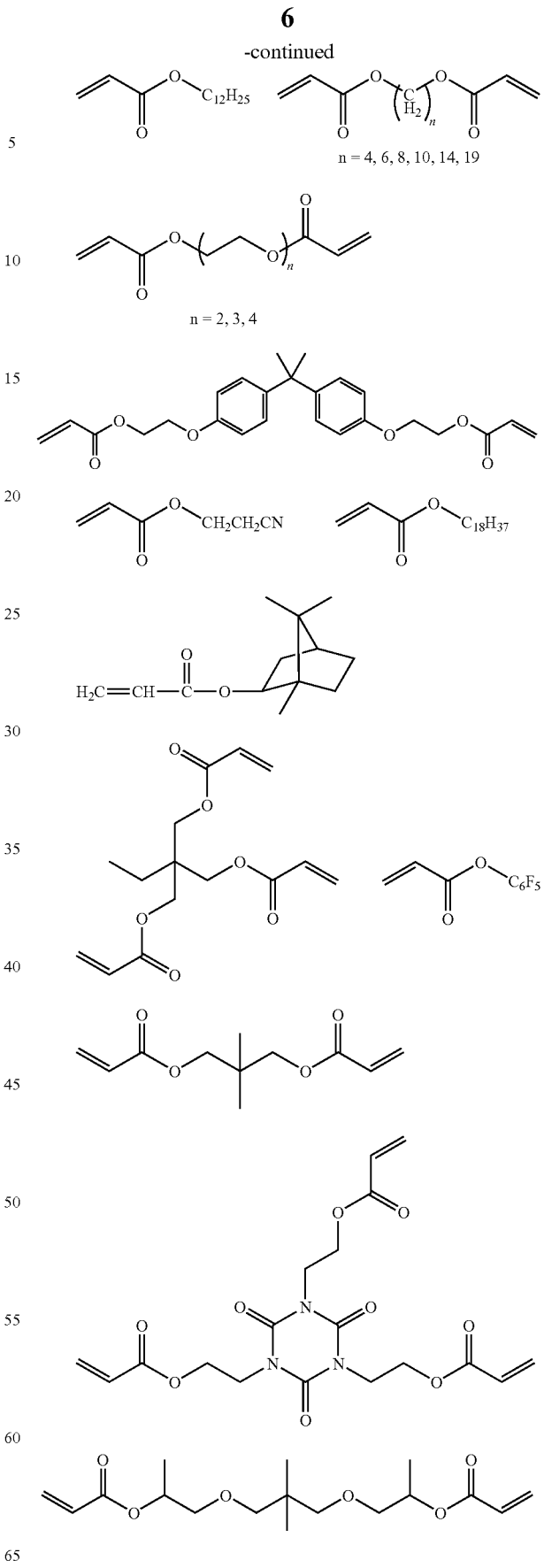

Other examples include the following compounds.

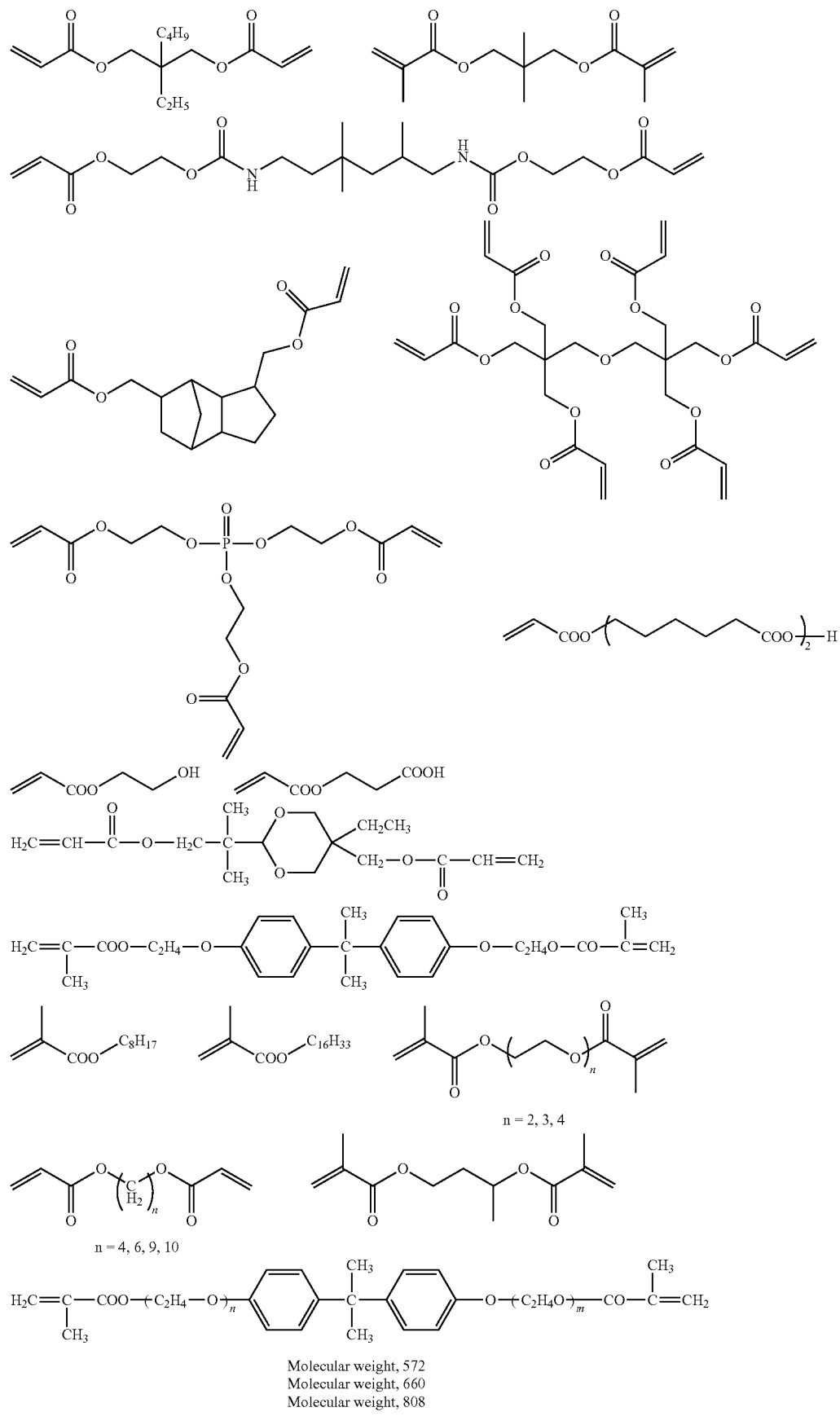
Molecular weight, 572
Molecular weight, 660
Molecular weight, 808

-continued

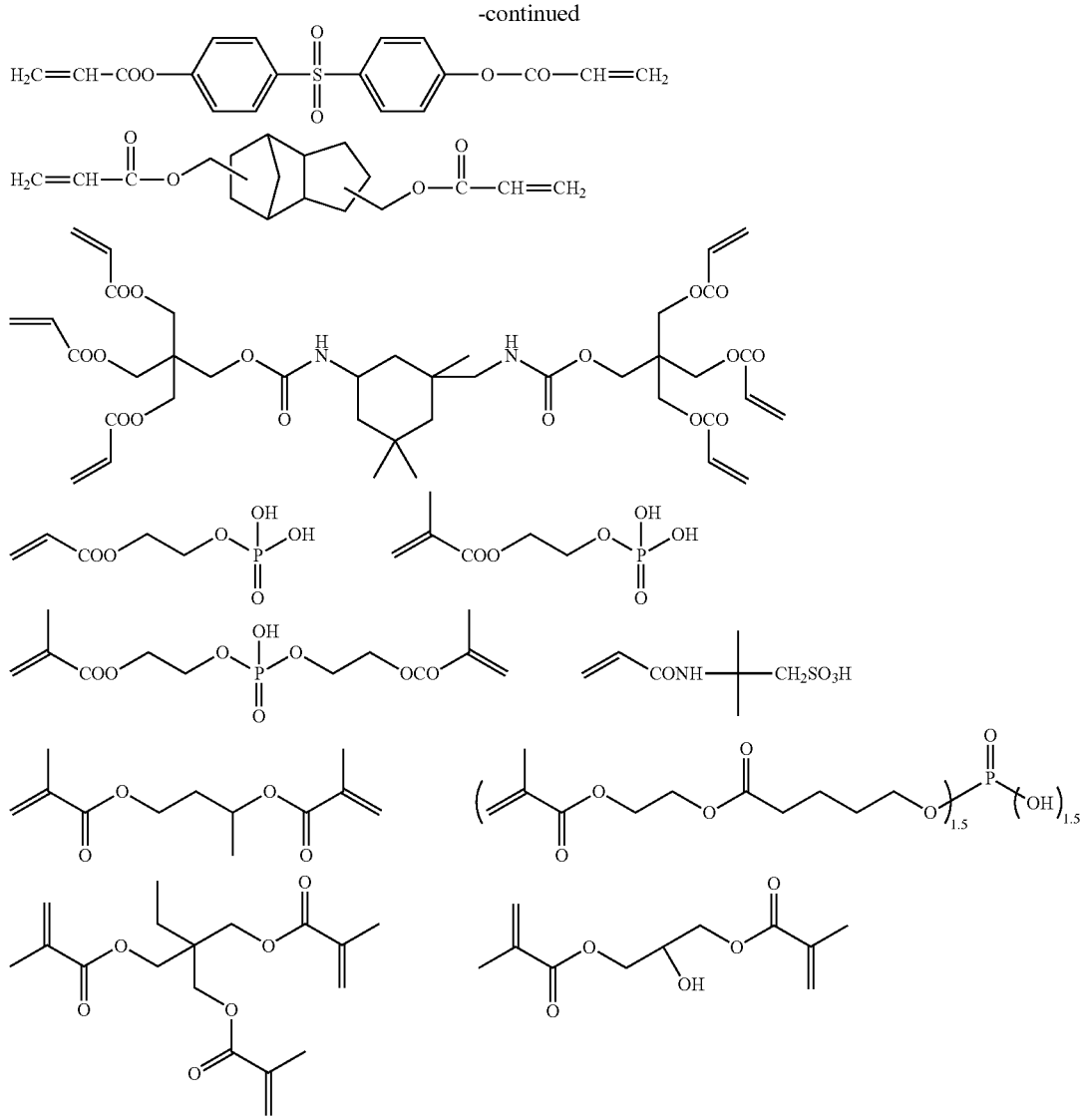

The method used for polymerizing the monomers is not particularly limited, and preferable exemplary methods include thermal polymerization, photopolymerization (by UV light, visible light), electron-beam polymerization, plasma polymerization, and combinations thereof. When the monomers are polymerized by thermal polymerization, the substrate B used should have reasonable heat resistance. In this case, the substrate B should at least have a glass transition temperature (Tg) higher than the temperature to which the substrate B is heated.

When the monomers are polymerized by photopolymerization, simultaneous use of a photopolymerization initiator is preferable. Exemplary photopolymerization initiators include Irgacure series (for example, Irgacure 651, Irgacure 754, Irgacure 184, Irgacure 2959, Irgacure 907, Irgacure 369, Irgacure 379, and Irgacure 819), Darocure series (for example, Darocure TPO and Darocure 1173), and Quantacure PDO commercially available from Ciba Specialty Chemicals Inc., and Esacure series (for example, Esacure TZM and Esacure TZT), and oligomer-type Esacure KIP series commercially available from Sartomer Company.

The beam used for the irradiation is typically UV light from a high pressure mercury vapor lamp or a low pressure mercury vapor lamp and the irradiation energy is preferably at least 0.5 J/cm$^2$, and more preferably at least 2 J/cm$^2$.

It should be noted that polymerization of the acrylate and methacrylate is inhibited by oxygen in the air, and accordingly, when such resin is used for the organic film 12 in the present invention, the polymerization is preferably conducted at a low oxygen concentration or oxygen partial pressure. When the oxygen concentration during the polymerization is reduced by flushing with nitrogen, the oxygen concentration is preferably reduced to the level of up to 2%, and more preferably to the level of up to 0.5%. When the oxygen partial pressure during the polymerization is reduced by reducing the pressure, the total pressure is preferably up to 1000 Pa, and more preferably up to 100 Pa. Particularly preferred is UV polymerization which involves irradiating at least 2 J/cm$^2$ of energy at a reduced pressure of up to 100 Pa.

In the present invention, the monomer is preferably polymerized to the degree of at least 80%, more preferably at least 85%, and still more preferably at least 90%. The term "degree of polymerization" used herein designates the percentage of the polymerizable groups that had reacted in the entire polymerizable groups (for example, acryloyl group and methacryloyl group in the case of acrylate and methacrylate) in the monomer mixture.

In the method for producing the functional film 10 according to the present invention, the most preferable organic film 12 is a film containing as its main component a polymer comprising a constitutional unit represented by the general formula (I) wherein m is 2 and a constitutional unit represented by the general formula (I) wherein m is at least 3.

$$(Z—COO)_m-L \qquad \text{General formula (I)}$$

In the general formula (I), Z is represented by the following (a) or (b):

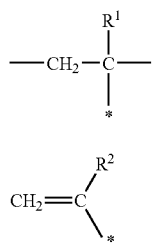

wherein $R^1$ and $R^2$ each independently represent hydrogen atom or methyl group and * indicates the site to which carbonyl group of the general formula (I) is bound; and L represents an m-valent linking group. While Z which is present at the number of "m" may be the same or different, at least one Z is the one represented by the formula (a).

Preferably, the organic film 12 is the one containing as its main component a polymer selected from a polymer comprising a constitutional unit wherein m is 2 and a constitutional unit wherein m is 3; a polymer comprising a constitutional unit wherein m is 2 and a constitutional unit wherein m is at least 4; and a polymer comprising a constitutional unit wherein m is 2, a constitutional unit wherein m is 3, and a constitutional unit wherein m is at least 4.

Alternatively, a combination of such polymers may constitute the major component of the organic film 12.

L is an m-valent linking group, and in the present invention, L may contain any number of carbon atoms. However, L may preferably contain 3 to 18 carbon atoms, more preferably 4 to 17 carbon atoms, still more preferably 5 to 16 carbon atoms, and most preferably 6 to 15 carbon atoms.

When m is 2, L is a divalent linking group. Examples of such divalent linking groups include alkylene groups (for example, 1,3-propylene group, 2,2-dimethyl-1,3-propylene group, 2-butyl-2-ethyl-1,3-propylene group, 1,6-hexylene group, 1,9-nonylene group, 1,12-dodecylene group, and 1,16-hexadecylene group), ether groups, imino groups, carbonyl groups, and divalent residues comprising two or more such divalent groups linked in tandem (for example, polyethyleneoxy group, polypropyleneoxy group, propionyloxy ethylene group, butyloyloxy propylene group, caproyloxy ethylene group, and caproyloxy butylene group).

Among these, an alkylene group is preferred.

L may have a substituent.

Exemplary substituents for the L include alkyl groups (for example, methyl group, ethyl group, and butyl group), aryl groups (for example, phenyl group), amino groups (for example, amino group, methylamino group, dimethylamino group, and diethylamino group), alkoxy groups (for example, methoxy group, ethoxy group, butoxy group, and 2-ethylhexyloxy group), acyl groups (for example, acetyl group, benzoyl group, formyl group, and pivaloyl group), alkoxycarbonyl groups (for example, methoxycarbonyl group and ethoxycarbonyl group), hydroxy group, halogen atoms (for example, fluorine atom, chlorine atom, bromine atom, and iodine atom), and cyano group. Preferable substituent is a group having no oxygen-containing functional group, and in particular, an alkyl group for the reason as described below.

When m is 2, L is most preferably an alkylene group having no oxygen-containing functional group. Use of such group enables a gas barrier film having a lower water vapor transmission rate to be produced when the present invention is used for the production of the gas barrier film.

When m is 3, L represents a trivalent linking group. Examples of such trivalent linking group include a trivalent residue obtained by removing one hydrogen atom from the divalent linking group as described above and a trivalent residue obtained by substituting any one of the hydrogen atoms of the divalent linking group as described above with an alkylene group, ether group, carbonyl group, or a divalent group comprising any of such groups tandemly coupled with one another. Among these, preferred is a trivalent residue which is obtained by removing one hydrogen atom from an alkylene group and which has no oxygen-containing functional group. Use of such group enables a gas barrier film having a lower water vapor transmission rate to be produced when the present invention is used for the production of the gas barrier film.

When m is 4 or more, L represents a linking group having a valence of 4 or higher. Examples and preferable examples of such linking group having a valence of 4 or higher corresponds to those as described above, and most preferred is a tetravalent residue which is obtained by removing any two hydrogen atoms from an alkylene group and which has no oxygen-containing functional group. Use of such group enables a gas barrier film having a lower water vapor transmission rate to be produced when the present invention is used for the production of the gas barrier film.

In the production method of the present invention, when the polymer constituting the organic film 12 is a polymer comprising a constitutional unit wherein m is 2 and a constitutional unit wherein m is at least 3 in the general formula (I), the constitutional unit wherein m is 2 and/or 3 may be preferably included in an amount of 75 to 95% by weight, more preferably 75 to 90% by weight, and still more preferably 75 to 85% by weight.

When the polymer constituting the organic film 12 is a polymer comprising a constitutional unit wherein m is 2 and a constitutional unit wherein m is 3 in the general formula (I), the constitutional unit wherein m is 2 may be preferably included in an amount of 60 to 80% by weight, and more preferably 65 to 75% by weight, whereas the constitutional unit wherein m is 3 may be preferably included in an amount of 10 to 50% by weight, and more preferably 20 to 40% by weight.

When the content is within such range, a balance will be effectively achieved between the film hardness and the degree of polymerization.

When the polymer constituting the organic film 12 is a polymer comprising a constitutional unit wherein m is 2 and a constitutional unit wherein m is at least 4 in the general formula (I), the constitutional unit wherein m is at least 4 may be preferably included in an amount of 10 to 50% by weight, and more preferably 20 to 40% by weight, and m is preferably 4.

When the polymer constituting the organic film 12 is a polymer comprising a constitutional unit wherein m is 2, a constitutional unit wherein m is 3, and a constitutional unit wherein m is at least 4 in the general formula (I), the constitutional unit wherein m is 2 and the constitutional unit wherein m is 3 may be preferably included in a total amount of 75 to 95% by weight, more preferably 75 to 90% by weight, and still more preferably 75 to 85% by weight; and the constitutional unit wherein m is at least 4 may be preferably included in an amount of 5 to 25% by weight, more preferably 10 to 25% by weight, and still more preferably 15 to 25% by weight.

The polymer which is the main component of the organic film 12 may also include a constitutional unit not represented by the general formula (I).

For example, the polymer may contain the constitutional unit formed in the copolymerization of an acrylate monomer or a methacrylate monomer. In this polymer, the constitutional unit not represented by the general formula (I) is preferably included in an amount of up to 20% by weight, more preferably up to 15% by weight, and still more preferably up to 10% by weight.

As described above, the organic film 12 is a film containing the polymer comprising the constitutional units represented by the general formula (I) as its main component. The term "main component" used in the present invention means that the polymer having the constitutional units represented by the general formula (I) accounts for at least 80% by weight of the total weight of the organic film. It is particularly preferable that such polymer account for at least 90% by weight of the organic film 12.

The polymer not containing the constitutional unit represented by the general formula (I) which may be incorporated in the organic film 12 is not particularly limited, and examples of such polymer include polyester, methacrylic acid-maleic acid copolymer, polystyrene, transparent fluororesin, polyimide, fluorinated polyimide, polyamide, polyamideimide, polyetherimide, cellulose acylate, polyurethane, polyetherketone, polycarbonate, alicyclic polyolefin, polyallylate, polyethersulfone, polysulfone, polycarbonate modified with fluorene ring, polycarbonate modified with an alicycle, and polyester modified with fluorene ring.

Such polymer which is the main component of the organic film 12 can be prepared by polymerizing a mixture (monomer mixture) containing a monomer wherein n is 2 in the following general formula (II) and a monomer wherein n is at least 3 in the following general formula (II).

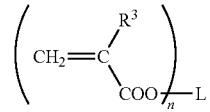

General formula (II)

In the general formula (II), $R^3$ represents hydrogen atom or methyl group, and L represents an n-valent linking group. When n is at least 2, each $R^3$ may be the same or different.

In other words, the production method of the functional film 10 of the present invention is most preferably a production method comprising the steps of forming an organic film 12 on a substrate B by polymerizing a monomer mixture containing a monomer wherein n is 2 and a monomer wherein n is at least 3 in the general formula (II), and subsequently, forming an inorganic film 14 by vacuum deposition. In this method, the conveyor means that contact the organic film 12 in vacuum, more specifically members of the conveyor means provided in vacuum on the organic film 12 side prior to forming the inorganic film 14 contact the organic film 12 only at the edges of the substrate Bo.

The preferable examples and preferable range for L are the same as those described for the general formula (I).

The preferable ranges for the contents of the monomer wherein n is 2 and the monomer wherein n is at least 3 (or the monomer wherein n is 3 and the monomer wherein n is at least 4) in the monomer mixture are also the same as the preferable ranges for the contents of the monomer wherein n is 2 and the monomer wherein n is at least 3 (or the monomer wherein n is 3 and the monomer wherein n is at least 4) in the general formula (I).

In the present invention, the organic film 12 is preferably formed by polymerizing a monomer mixture containing a monomer wherein n is 2 and a monomer wherein n is 3, by polymerizing a monomer mixture containing a monomer wherein n is 2 and a monomer wherein n is at least 4, or by polymerizing a monomer mixture containing a monomer wherein n is 2, a monomer wherein n is 3, and a monomer wherein n is at least 4.

Alternatively, the organic film 12 may be formed by polymerizing two or more of such monomer mixtures.

Examples of the monomer wherein n is 2 or 3 in the general formula (II) are shown below, which by no means limit the monomer wherein n is 2 or 3 that can be used in the present invention.

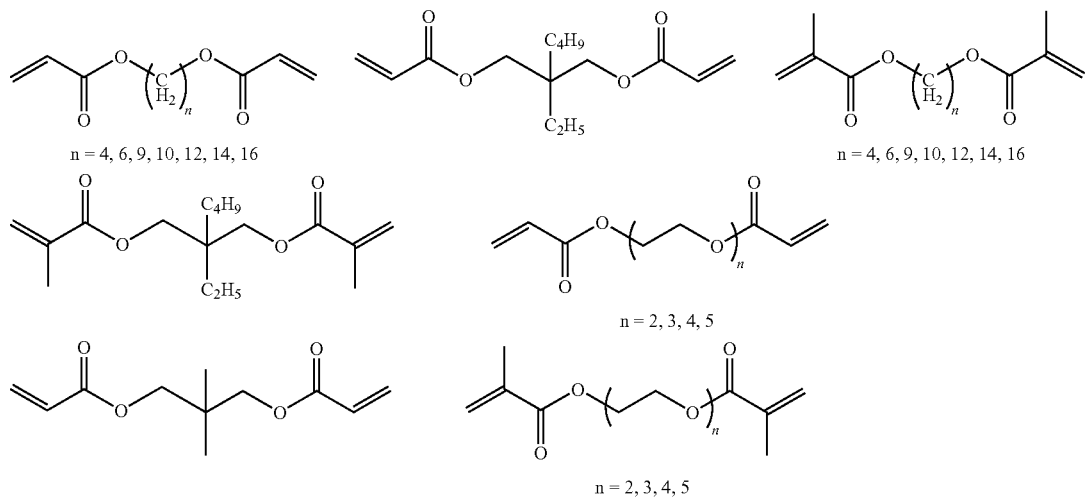

-continued
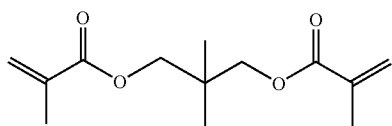
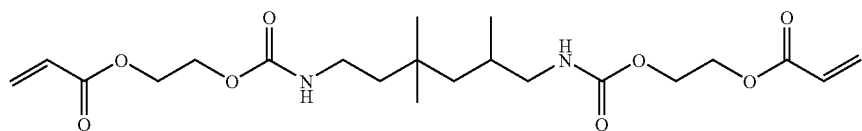
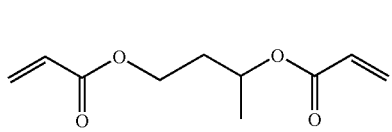 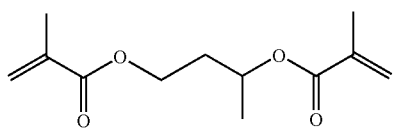
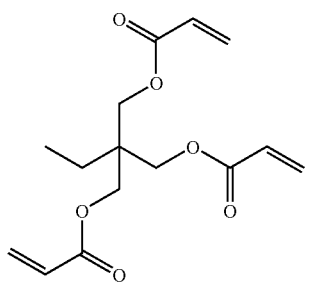 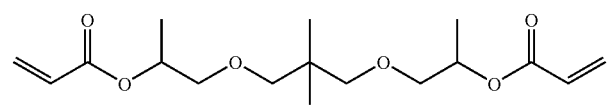
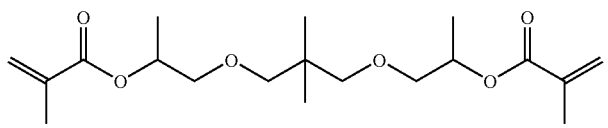 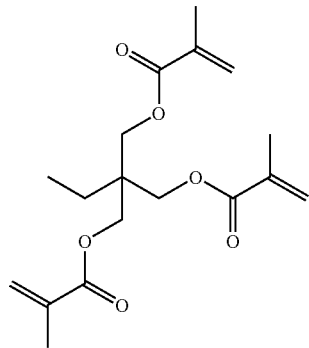
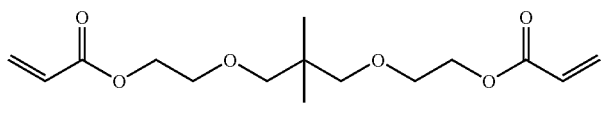 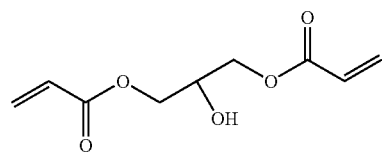
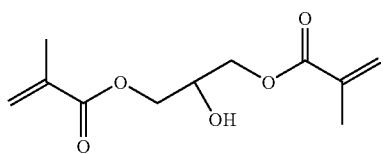 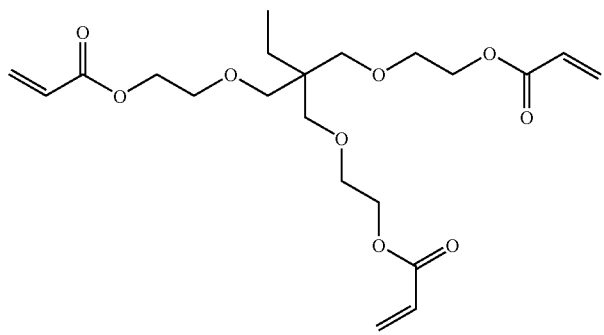

-continued

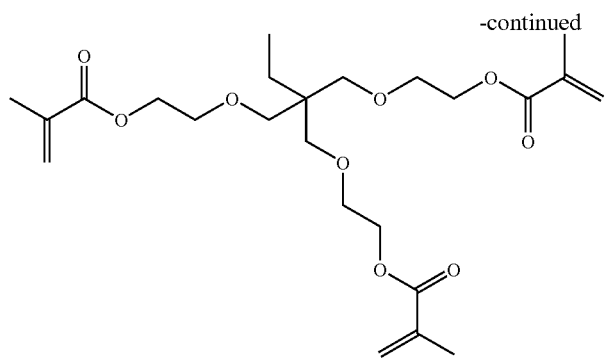

The monomer wherein n is at least 4 in the general formula (II) is preferably a monomer wherein n is 4 to 6, and more preferably, a monomer wherein n is 4. Exemplary such monomers include a monomer having a pentaerythritol skeleton or dipentaerythritol skeleton.

Examples of the monomer wherein n is at least 4 in the general formula (II) are shown below, which by no means limit the monomer wherein n is at least 4 that can be used in the present invention.

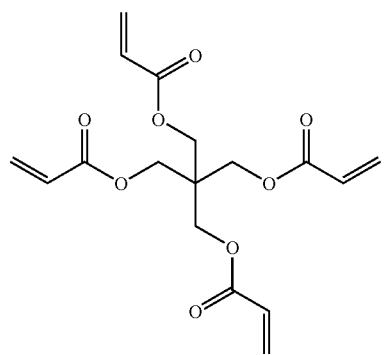

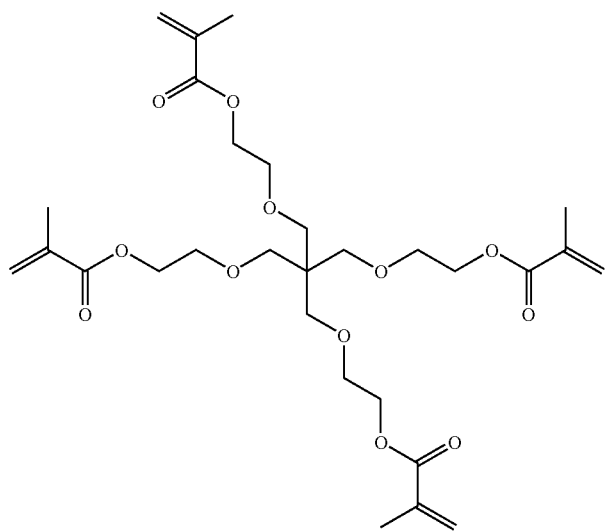

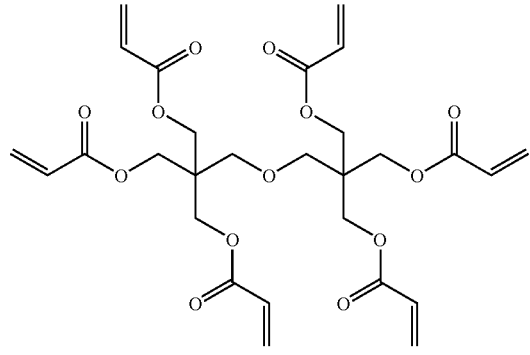

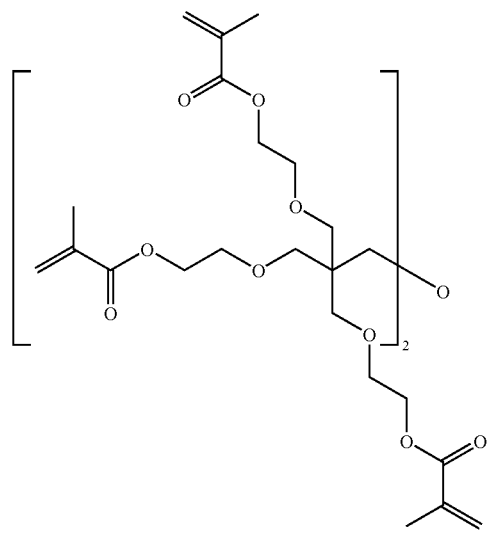

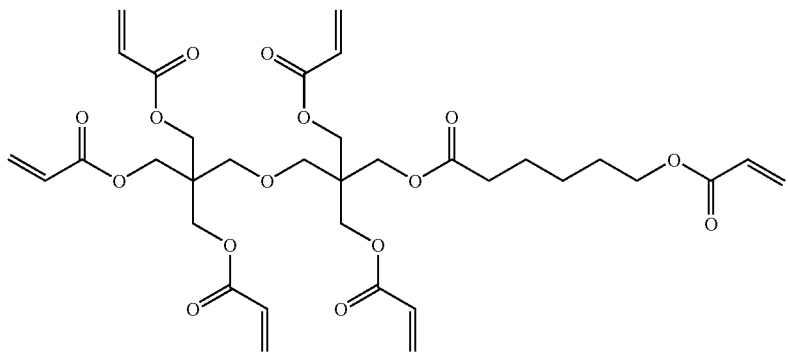
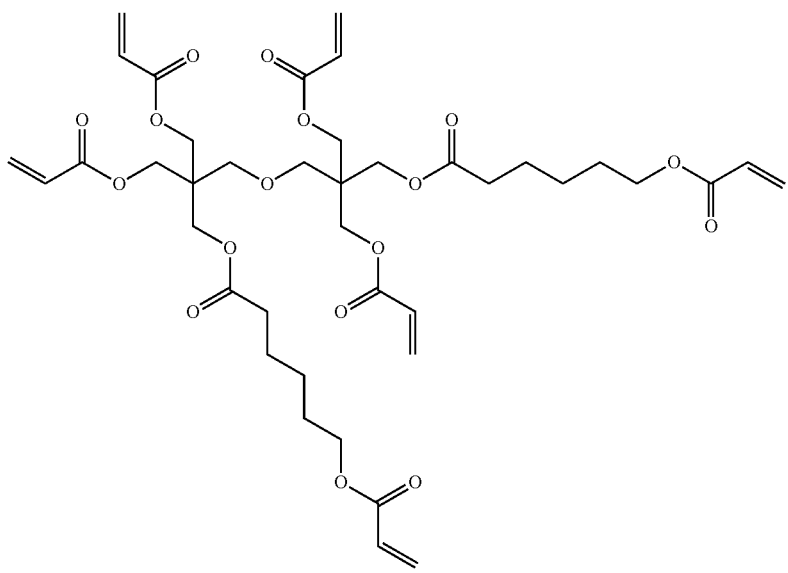
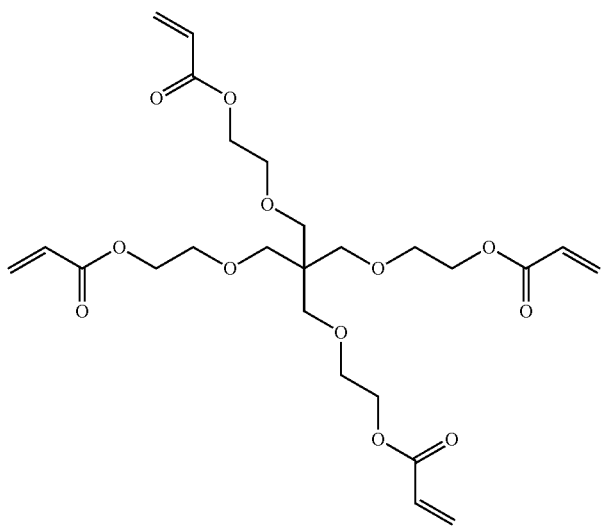

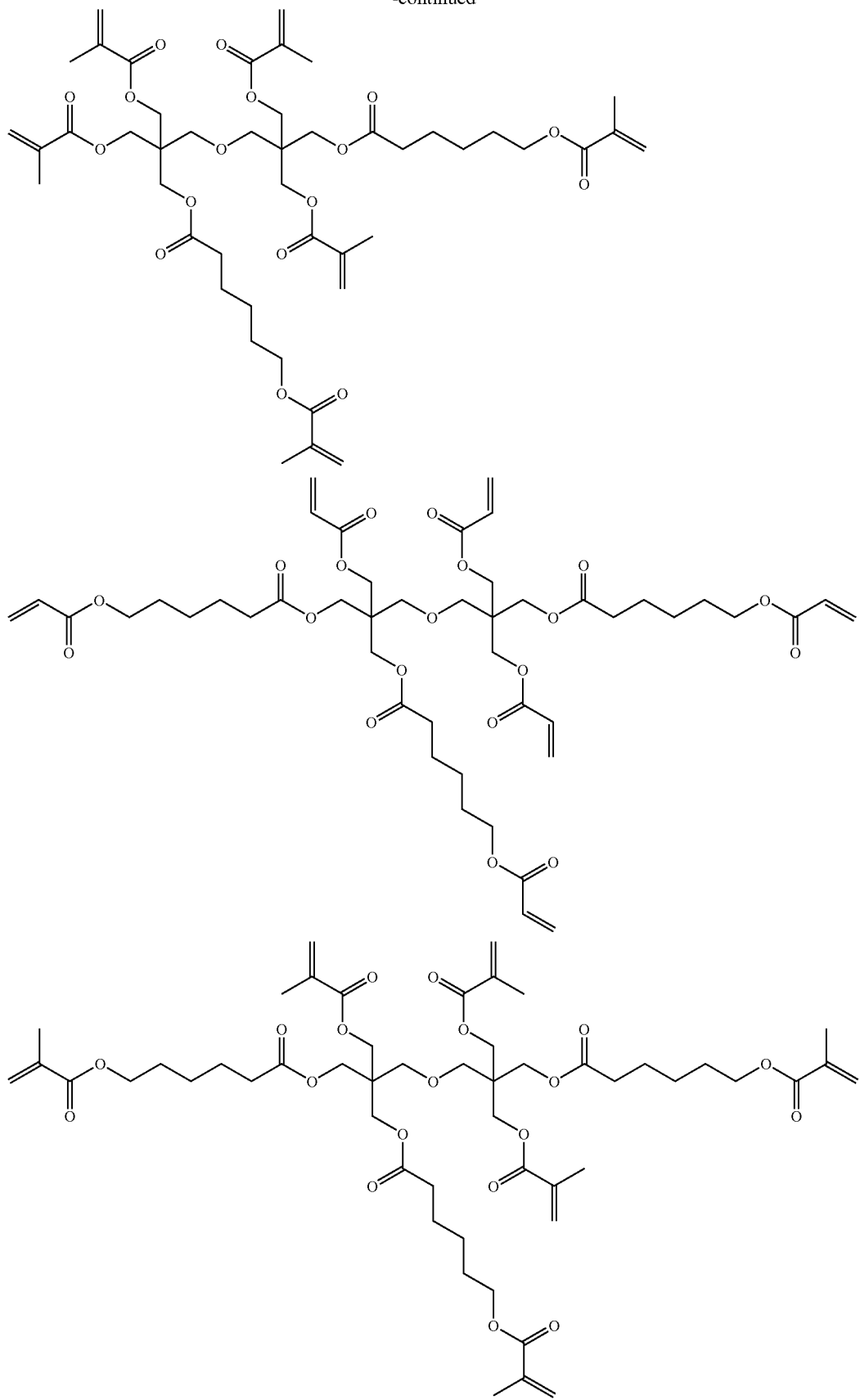

The monomer mixture may contain one type of or two or more types of monomer for each of the monomer wherein n is 2 and the monomer wherein n is at least 3 (or the monomer wherein n is 3 and the monomer wherein n is at least 4) in the general formula (II).

As described above, in the present invention, the resulting functional film will have favorable properties when the organic film 12 is harder.

The hardness of the organic film 12 can be increased, for example, by the following methods:

(1) the degree of polymerization of the monomer is increased;
(2) a polyfunctional monomer is used; and
(3) an oxygen-containing functional group which is highly flexible as the linking group of the monomer is not used.

The degree of polymerization and the number of functional groups are in a trade off relation, and more specifically, the degree of polymerization reduces with the increase in the number of functional groups. The inventors of the present invention examined the composition of the polymer and found that such monomer mixing rate is preferable in order to have an increased number of functional groups of the monomer and an increased degree of polymerization.

In order to form the organic film 12 having favorable hardness, the mixing ratio of the monomer components are preferably adjusted in the range as described below.

For example, when only the monomer wherein n is 2 and the monomer wherein n is 3 are used for the monomer mixture as the monomer components represented by the general formula (II), the monomer wherein n is 2 is preferably used at a mixing ratio of 60 to 80% by weight, and more preferably 65 to 75% by weight. The monomer wherein n is 3 is preferably used at a mixing ratio of 20 to 40% by weight, and more preferably 25 to 35% by weight.

When only the monomer wherein n is 2 and the monomer wherein n is at least 4 are used for the monomer mixture as the monomer components represented by the general formula (II), the monomer wherein n is 2 is preferably used at a mixing ratio of 75 to 95% by weight, more preferably 75 to 90% by weight, and still more preferably 75 to 85% by weight. The monomer wherein n is at least 4 is preferably used at a mixing ratio of 5 to 25% by weight, more preferably 10 to 25% by weight, and still more preferably 15 to 25% by weight.

When only the monomer wherein n is 2, the monomer wherein n is 3, and the monomer wherein n is at least 4 are used for the monomer mixture as the monomer components represented by the general formula (II), the monomer wherein n is 2 and the monomer wherein n is 3 are preferably used at a total mixing ratio of 75 to 95% by weight, more preferably 75 to 90% by weight, and still more preferably 75 to 85% by weight. The monomer wherein n is at least 4 is preferably used at a mixing ratio of 5 to 25% by weight, more preferably 10 to 25% by weight, and still more preferably 15 to 25% by weight.

The monomer mixture used for forming the organic film 12 may also include monomers not represented by the general formula (II). These monomers, however, have adverse effects on the increase in the hardness of the organic film 12, and accordingly are preferably used in the monomer mixture in an amount of up to 20% by weight.

Examples of the monomers not represented by the general formula (II) include monofunctional monomers, and preferably, monofunctional acrylate monomers and monofunctional methacrylate monomers. The monofunctional acrylate monomers and the monofunctional methacrylate monomers are not particularly limited for their molecular weight. However, typical molecular weight of such monomers used is in the range of 150 to 600. The monomer mixture may contain one, or two or more of such monomers. While the monofunctional monomer is effective in increasing the degree of polymerization, excessive incorporation results in the loss in the hardness of the organic film formed, and therefore, the content is preferably adjusted to 20% by weight or less. Such monomer is more preferably used in the content which is the same as the preferable content of the constitutional unit not represented by the general formula (I).

Examples of the preferable monofunctional monomers are shown below, which by no means limit the monofunctional monomers that can be used in the present invention.

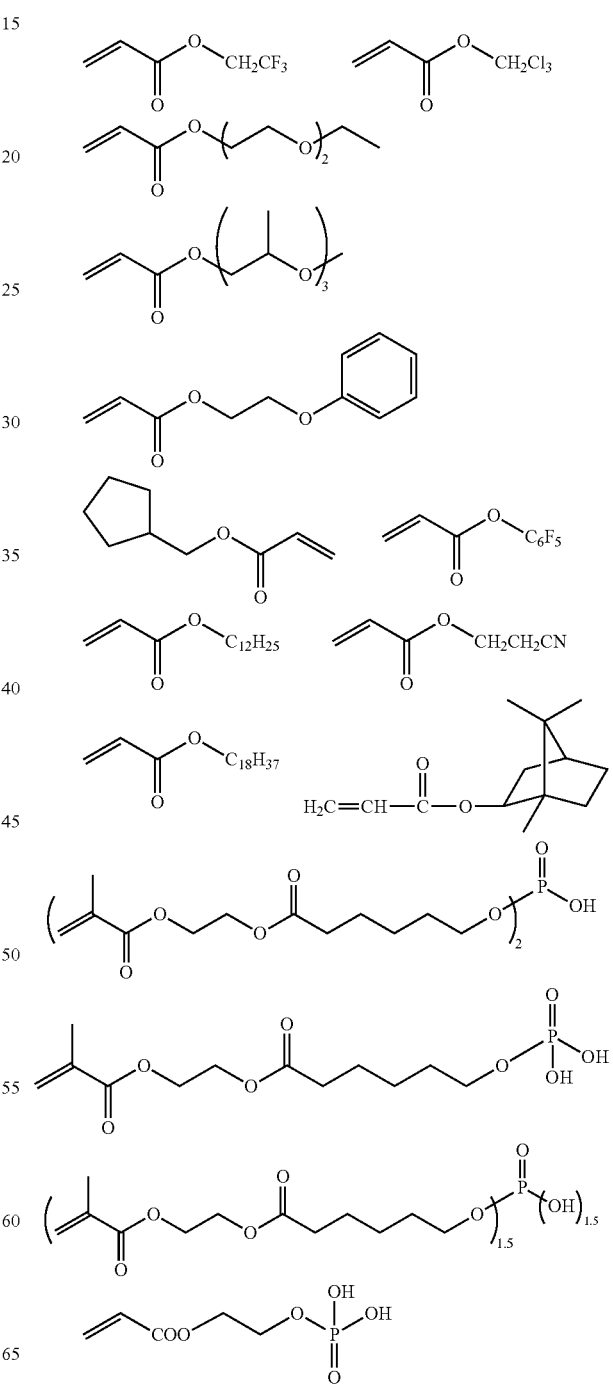

-continued

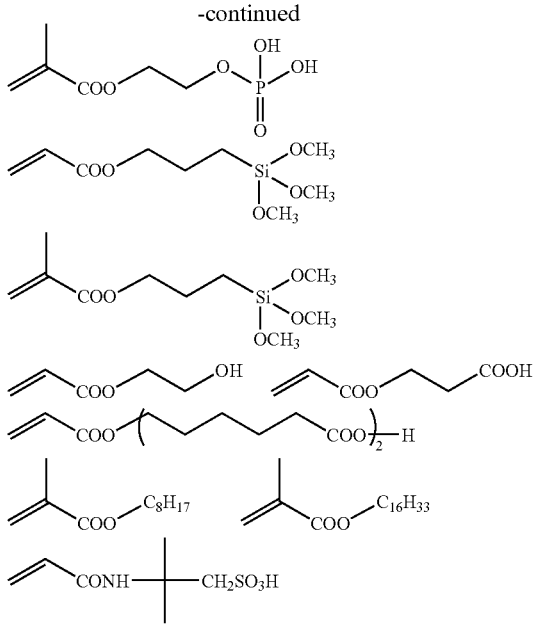

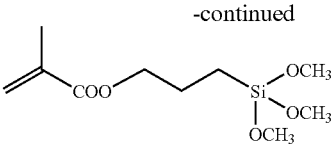

The monomer mixture for forming the organic film 12 may also contain a phosphate (meth)acrylate monomer or a (meth)acrylate monomer containing a silane coupling group in order to improve the adhesion. Such monomer may be added within the range as described above depending on its number of functional groups.

Preferable examples of the phosphate monomer or the monomer containing a silane coupling group are shown below, which by no means limit the scope of the present invention.

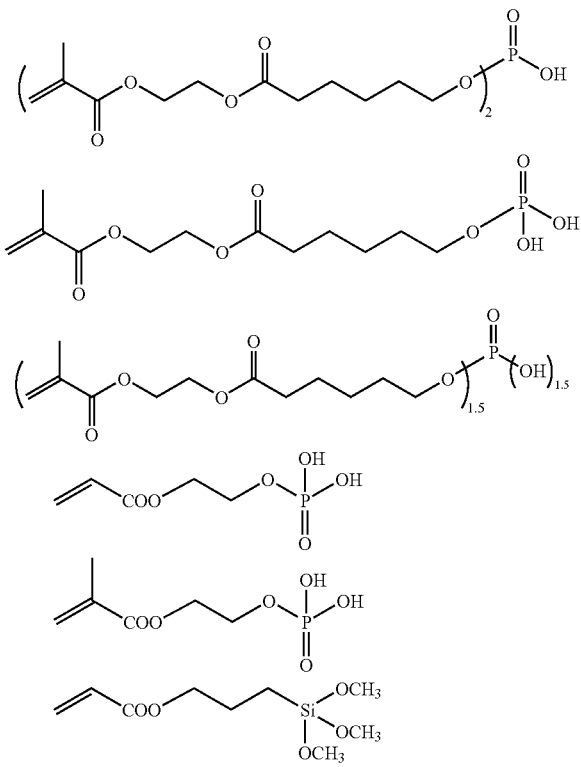

As described above, the organic film forming device 20 includes the coater means 26, the dryer means 28 and the UV irradiator 30. The coater means 26 is used to apply a preliminarily prepared coating composition containing the monomer mixture to the substrate B, which is followed by drying for polymerization to form the organic film 12.

The illustrated organic film forming device 20 irradiates the monomer mixture with UV light for polymerization to form the organic film 12.

In the present invention, the coating composition containing the monomer mixture preferably contains a photoinitiator when the organic film 12 is formed by photopolymerization, for example, by irradiating the coating with UV or visible light.

The substrate B fed from the substrate roll 40 is nipped by the conveyor roller pair 36 to be conveyed first to the coater means 26, where the preliminarily prepared coating composition containing the monomer constituting the organic film 12 is applied to the surface of the substrate B.

As described above, commonly used liquid application methods are all available for applying this coating composition.

The substrate B is then conveyed to the dryer means 28, where the coating composition applied by the coater means 26 is dried.

The method used for drying the coating composition is not particularly limited, and any method may be selected from those known in the art depending on the speed at which the substrate B is conveyed as long as the coating composition can be dried before the substrate B reaches the UV irradiator 30. Exemplary drying methods include heating with a heater and heating with hot air.

The substrate B is then conveyed to the UV irradiator 30, where the coating composition applied by the coater means 26 and dried by the dryer means 28 is irradiated with UV light to polymerize the monomer to thereby form the organic film 12.

The light source that can be used and the irradiation energy are as described above. The method used for the polymerization of the monomer is also not limited to the UV irradiation as in the illustrated embodiment, and as described above, various methods may be used for the monomer polymerization.

When the organic film 12 is the one prepared by polymerizing an acrylate monomer and/or a methacrylate monomer, a low oxygen concentration should be used during the polymerization as described above.

In the present invention, the solution coating method as in the embodiment shown in FIG. 2A is not the sole method used for forming the organic film 12. As also described above, vacuum deposition techniques such as vapor deposition and plasma CVD may also be advantageously used and most preferred is the flash evaporation described in U.S. Pat. No. 4,842,893, U.S. Pat. No. 4,954,371, and U.S. Pat. No. 5,032,461.

Figure 2B:
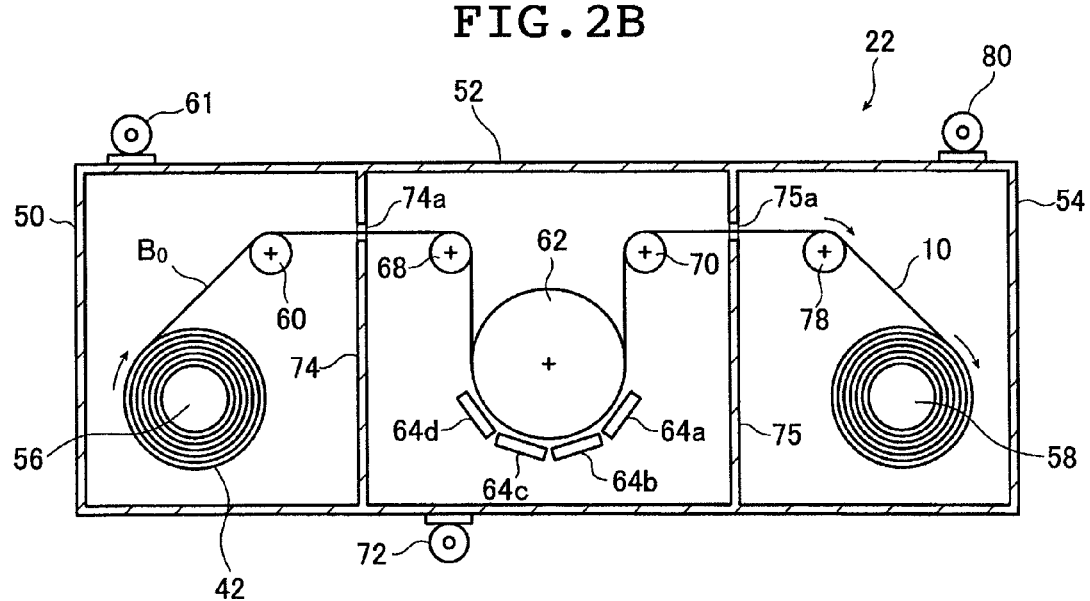

The substrate Bo having the organic film 12 formed in the manner described above is nipped and conveyed by the conveyor roller pair 38 to reach the winding shaft 34, which winds the substrate Bo to give a substrate roll 42, which is then mounted in the inorganic film forming device 22 as shown in FIG. 2B.

In the method for producing the functional film 10 of the present invention, the organic film is not limited to the one comprising a single layer as in the illustrated embodiment but may comprise two or more layers.

In the latter case, the respective layers may have the same composition or different compositions. When two or more layers of organic film are formed on the substrate, each layer may preferably have the composition that falls within the range as described above.

The inorganic film forming device 22 is provided for depositing (forming) the inorganic film 14 on the surface of the substrate Bo (namely, on the surface of the organic film 12) by vacuum deposition, and it includes a feed chamber 50, a film forming chamber 52 and a take-up chamber 54.

As in the organic film forming device 20, the inorganic film forming device 22 also carries out film deposition by a roll-to-roll system. The inorganic film 14 is formed on the substrate Bo fed from the substrate roll 42 and conveyed in the longitudinal direction, and the functional film 10 having the organic film 12 and the inorganic film 14 formed on the substrate B is then wound on a winding shaft 58 into a roll.

The feed chamber 50 includes a rotary shaft 56, a guide roller 60 and a vacuum evacuation means 61.

The substrate roll 42 in which the substrate Bo having the organic film 12 formed on the substrate B is wound is mounted on the rotary shaft 56 of the feed chamber 50 in the inorganic film forming device 22.

Once the substrate roll 42 is mounted on the rotary shaft 56, the substrate Bo is conveyed along a predetermined pathway along which the substrate Bo travels from the feed chamber 50 through the film forming chamber 52 to the winding shaft 58 of the take-up chamber 54. In the inorganic film forming device 22 as well, the feed of the substrate Bo from the substrate roll 42 and the winding of the functional film 10 on the winding shaft 58 proceeds in synchronism so that the substrate Bo in the form of a long film strip is conveyed in its longitudinal direction along the predetermined pathway while the continuous formation of the inorganic film 14 on the substrate Bo is carried out.

In the feed chamber 50, the rotary shaft 56 is rotated by a drive source (not shown) in a clockwise direction in FIG. 2B so that the substrate Bo is fed from the substrate roll 42 and conveyed by the guide roller 60 along the predetermined pathway to the film forming chamber 52.

The feed chamber 50 is provided with the vacuum evacuation means 61, which evacuates the feed chamber 50 to a predetermined degree of vacuum (pressure) appropriate for the film forming pressure in the film forming chamber 52. The internal pressure of the feed chamber 50 is thus prevented from adversely affecting the internal pressure of the film forming chamber 52 (i.e., film deposition). Any known device may be used for the vacuum evacuation means 61 as in a vacuum evacuation means 72 of the film forming chamber 52 to be described later.

The guide roller 60 that contacts the organic film 12 in vacuum is a stepped roller that contacts the organic film 12 only at the ends of the substrate Bo (both ends in a direction perpendicular to the direction of conveyance (i.e., in the width direction of the substrate Bo)). This point will be described later in further detail.

In addition to the illustrated members, the feed chamber 50 may also have various members (conveyor means) for conveying the substrate Bo along the predetermined pathway, as exemplified by a conveyor roller pair and a guide member for regulating the position in the width direction of the substrate Bo. However, a member should contact the organic film 12 only at the ends of the substrate Bo as in the guide roller 60 in the form of a stepped roller because the feed chamber 50 is adjusted to the degree of vacuum appropriate for the pressure of the film forming chamber.

The substrate Bo is guided by the guide roller 60 to be conveyed to the film forming chamber 52, where the inorganic film 14 is deposited (formed) on the surface of the substrate Bo (i.e., on the surface of the organic film 12) by vacuum deposition. In the illustrated embodiment, the film forming chamber 52 includes a drum 62, film forming means 64a, 64b, 64c and 64d, guide rollers 68 and 70, and the vacuum evacuation means 72. When sputtering or plasma CVD is carried out for film deposition in the film forming chamber 52, an RF power supply is also provided in the film forming chamber 52.

The substrate Bo is conveyed to the film forming chamber 52 through a slit 74a formed in a separation wall 74 between the feed chamber 50 and the film forming chamber 52.

In a preferred embodiment, the illustrated inorganic film forming device 22 also has the vacuum evacuation means in the feed chamber 50 and the take-up chamber 54 so that the feed chamber 50 and the take-up chamber 54 are also evacuated depending on the film forming pressure in the film forming chamber 52. However, the device for implementing the present invention is not limited to this but may be of a structure in which the feed chamber 50 and the take-up chamber 54 are provided with no vacuum evacuation means and the slits through which the substrate Bo passes have the minimum size which allows the substrate B to pass through the slits without contacting the slits so that the film forming chamber 52 is rendered substantially airtight. Alternatively, another structure may be used in which the feed chamber 50 and the take-up chamber 54 are provided with no vacuum evacuation means, and subchambers through which the substrate B passes are provided between the feed chamber 50 and the film forming chamber 52 and between the film forming chamber 52 and the take-up chamber 54, respectively and evacuated by a vacuum pump.

In the case of providing a subchamber upstream of the film forming chamber 52 (upstream in the direction of conveyance of the substrate B), a means for conveying the substrate within the subchamber should be of a structure in which it contacts the organic film 12 only at the ends of the substrate Bo.

The drum 62 in the film forming chamber 52 is a cylindrical member which rotates around the central axis in the counterclockwise direction as shown in FIG. 2B.

The substrate Bo fed from the feed chamber 50 and guided by the guide roller 68 along a predetermined pathway is wrapped around a predetermined region of the peripheral surface of the drum 62 so that it is supported and guided by the drum 62, and then, conveyed along the predetermined pathway. The inorganic film 14 is formed on the surface (namely, on the organic film 12) by the film forming means 64a to 64d and the like. When sputtering or plasma CVD is carried out for film deposition in the film forming chamber 52, the drum 62 may be grounded so that it also functions as a counter electrode. Alternatively, the drum 62 may be connected to the RF power supply.

The film forming means 64a to 64d are provided for forming the inorganic film 14 on the surface of the substrate Bo having the organic film 12 formed on the substrate B by vacuum deposition.

The method used for the formation of the inorganic film 14 in the present invention is not particularly limited, and any vacuum deposition (vapor-phase deposition) techniques known in the art such as CVD, plasma CVD, sputtering, vacuum evaporation, and ion plating may be used.

Accordingly, in the film forming chamber 52 of the inorganic film forming device 22, the film forming means 64a to 64d include various members adequately selected depending on the method of vacuum deposition used for the film formation.

For example, when the inorganic film 14 is formed in the film forming chamber 52 by ICP-CVD (inductively coupled plasma CVD), the film forming means 64a to 64d include an induction coil for forming an induced magnetic field, and a gas supply means for supplying a reactive gas on the region where the film is formed.

When the film forming chamber 52 is the one where the inorganic film 14 is formed by CCP-CVD (capacitively coupled plasma CVD), the film forming means 64a to 64d include a shower head electrode which is hollow and has a large number of small holes at the surface facing the drum 62, which is connected to the reactive gas supply source, and which functions as an RF electrode and a means for supplying the reactive gas.

When the film forming chamber 52 is the one where the inorganic film 14 is formed by CVD, the film forming means 64a to 64d include a means for introducing the reactive gas.

When the film forming chamber 52 is the one where the inorganic film 14 is formed by sputtering, the film forming means 64a to 64d include a means for supporting a target, an RF electrode, and a means for supplying a sputtering gas.

The vacuum evacuation means 72 is used for evacuating the film forming chamber 52 to a degree adequate for the formation of the inorganic film 14 by vacuum deposition.

The vacuum evacuation means 72 is not particularly limited, and exemplary means that may be used include vacuum pumps such as a turbo pump, a mechanical booster pump and a rotary pump, an assist means such as cryogenic coil, and various other known (vacuum) evacuation means which use a means for adjusting the ultimate degree of vacuum or the amount of discharge air and are employed in vacuum deposition devices.

The substrate Bo on which the inorganic film 14 has been formed by the film forming means 64a to 64d as it was supported and conveyed on the drum 62, that is, the functional film 10 is then guided by the guide roller 70 on the predetermined pathway to be conveyed to the take-up chamber 54, where the functional film 10 is wound on the winding shaft 58 into a roll.

Figure 3:
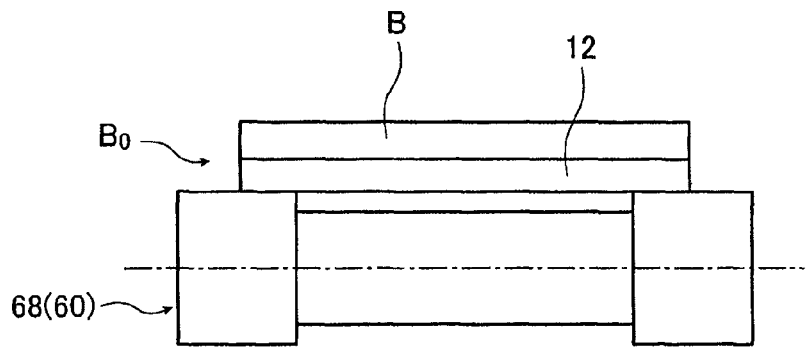
FIG. 3 is a schematic view showing a stepped roller that may be used in the functional film production method of the present invention.

In the illustrated inorganic film forming device 22, the guide roller 60 of the feed chamber 50 and the guide roller 68 of the film forming chamber 52 that contact the organic film 12 in vacuum are stepped rollers each having, as schematically shown in FIG. 3, a larger diameter at both the ends in the width direction of the substrate Bo than in the other regions. Therefore, these stepped portions enable the guide rollers 60 and 68 to convey the substrate Bo (guide the substrate Bo along the predetermined pathway) while only contacting both the ends of the substrate Bo. In other words, the inorganic film forming device 22 employs the stepped rollers as the conveyor means that contact the organic film 12 in vacuum to enable the conveyor means to contact the organic film 12 only at the ends of the substrate Bo.

The production method of the present invention thus employs the conveyor means (i.e., substrate handling means) that contact in vacuum the predetermined organic film 12 having been formed only at the ends of the substrate Bo. The present invention having such a structure can consistently produce a high quality functional film 10 which has the organic film 12 and the inorganic film 14 and which is capable of preventing the deterioration of the performance or properties of the organic film 12 and its surface properties and exhibiting sufficient performance or properties of the organic film 12, thus having the intended performance.

The inventors of the present invention made an intensive investigation to realize a functional film such as a gas barrier film having high performance, and as a result found that the performance of the resulting functional film can be improved by providing, as described in JP 2002-264274 A as well, an organic film underneath the inorganic film which has the intended function.

The inventors of the present invention made further investigation, and found that a functional film having an even higher performance can be produced by using an organic film 12 containing as its main component a polymer produced by polymerizing an acrylate monomer and/or methacrylate monomer, and in particular, by using an organic film 12 containing as its main component a polymer comprising a constitutional unit represented by the general formula (I) wherein m is 2 and a constitutional unit wherein m is at least 3.

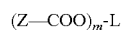

(Z—COO)$_m$-L                      General formula (I)

In the general formula (I), Z is represented by the following (a) or (b):

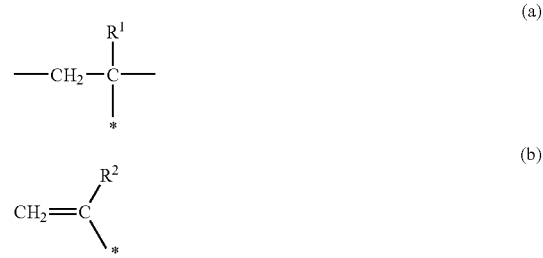

wherein $R^1$ and $R^2$ each independently represent hydrogen atom or methyl group and * indicates the site to which carbonyl group of the general formula (I) is bound; and L represents an m-valent linking group. While Z which is present at the number of "m" may be the same or different, at least one Z is the one represented by the formula (a).

The reason why the improvement in the performance of the functional film is realized by the provision of the organic film 12 is unknown. The speculation of the inventors of the present invention, however, is as described below.

The organic film 12 has excellent surface smoothness and other surface properties, and when the inorganic film 14 is formed on the organic film 12 by vacuum deposition, crystallinity and the direction of the crystal growth of the inorganic film 14 will be favorable, and the resulting inorganic film 14 will be extremely compact with excellent crystallinity and high smoothness.

As a consequence, the inorganic film 14 will be capable of fulfilling the intended function, and a high quality functional film having the intended performance is thereby realized.

However, in the course of the investigation, the inventors of the present invention found that the resulting functional film often failed to exhibit the intended performance when the inorganic film 14 is formed on the organic film 12 by vacuum deposition.

In the course of the investigation for finding the cause for such phenomenon, the inventors of the present invention found that the conveyor means such as the guide rollers and the conveyor roller pairs provided in the vacuum chamber where the vacuum deposition takes place had been the cause. In the further investigation, the inventors also found that, while no problem occurs at atmospheric pressure (normal pressure) or at a low degree of vacuum, surface smoothness and other properties are greatly damaged when something comes in contact with the surface in vacuum in which vacuum deposition is carried out (for example, at a pressure of up to 1000 Pa), and more specifically, such damage is significant when the surface of the organic film 12 is pressed as in the case where the substrate is nipped and conveyed by the conveyor roller pairs or in the case where the pathway is changed by the guide rollers.

The inventors also found that such damage is significant when the organic film 12 is an organic film containing a polymer produced by polymerizing an acrylate monomer and/or methacrylate monomer having an ethylenically unsaturated bond as its main component, and in particular, an organic film containing as its main component a polymer comprising a constitutional unit represented by the general formula (I) wherein m is 2 and a constitutional unit represented by the general formula (I) wherein m is at least 3. The damage is also likely to occur when the acrylate monomer and/or the methacrylate monomer has a molecular weight exceeding 700.

The reason why such damage of the organic film 12 occurs is unknown. The speculation of the inventors of the present invention, however, is as described below.

The organic film 12 does not show any change at atmospheric pressure, and there is no problem even if the substrate is conveyed (or handled) by the conveyor roller pairs or a surface treatment is conducted by bringing the surface into contact with some member.

However, in vacuum, the monomer which failed to react precipitates from the organic film 12 to its surface, and when a member such as the conveyor roller pair contacts the surface, this monomer is transferred onto this member and then retransferred onto the surface of the organic film 12. When the member such as the guide roller presses the organic film 12, the unreacted monomer having been transferred onto such member and the unreacted monomer having precipitated on or in the vicinity of the surface of the organic film 12 will be pushed into the organic film 12. As a consequence, the surface smoothness and other surface properties of the organic film 12 are greatly damaged when the member contacts or presses the surface of the organic film 12.

Accordingly, the crystallinity and the direction of the crystal growth of the inorganic film 14 are greatly damaged when the inorganic film 14 is formed on such surface, and the inorganic film 14 will also have cracks and missing parts, which adversely affects the function of the inorganic film 14. In such a case, production of the functional film having the intended performance is no longer possible.

The present invention has been completed on the bases of such findings, and a member such as a stepped roller shown in FIG. 3 which contacts the organic film 12 only at the ends of the substrate Bo is used for the conveyor means that contacts in vacuum the predetermined organic film 12 as described above in detail after it has been formed.

In general, the functional film produced by forming various films on the substrate is not used as a product for the whole part, and the portions in the vicinities of the film ends are cut or do not need to serve as part of a functional film even if they are used without being cut. In other words, the ends of the functional film have no problem as a product even if they have inferior or reduced performance or properties.

Therefore, the method for producing a functional film according to the present invention in which a conveyor means that contacts the ends of the substrate Bo or other portions where the organic film 12 does not exhibit its functions is capable of realizing consistent production of a functional film which has the intended performance and in which the performance and properties of the organic film 12 in the regions actually used as the product are prevented from deteriorating to achieve excellent surface smoothness and other surface properties so that the overlying inorganic film 14 can fully exhibit its inherent performance.

The "ends (vicinities of the ends) of the substrate Bo or other portions where the organic film 12 does not exhibit its functions" as used herein include, as described above, the end portions of the substrate Bo which are cut and removed, and hence are not actually used as a product, and the end portions of the substrate Bo which are not cut or removed but do not need to serve as a functional film. These portions are set as appropriate depending on the application of the functional film 10 produced by the production method of the present invention.

Figure 4:
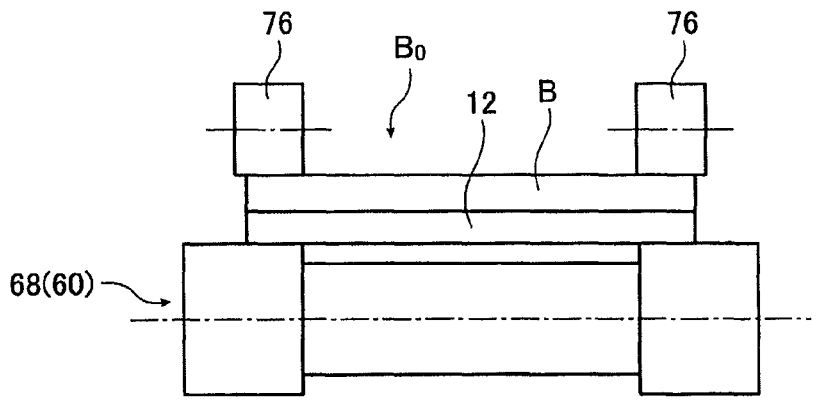
FIG. 4 is a schematic view showing another stepped roller that may be used in the functional film production method of the present invention.

In the present invention, it is preferable to provide nip rollers 76 as schematically shown in FIG. 4 so that the ends of the substrate Bo are nipped and conveyed between the guide rollers 60 and 68, and the nip rollers 76 to prevent the substrate Bo from slipping on the guide rollers 60 and 68 (stepped rollers) thus ensuring conveyance of the substrate Bo.

Alternatively, a common straight-type roller that contacts the whole area in the width direction of the substrate Bo may be used instead of the nip rollers of the type as shown in FIG. 4 which are used with the guide rollers 60 and 68 (stepped rollers) contacting the organic film 12 to nip only the ends of the substrate Bo therebetween.

In the production method of the present invention, the inorganic film 14 to be formed is not particularly limited, and a film of any inorganic substance suitable for the functional film 10 to be produced may be used as long as such film can be formed by vacuum deposition.

In addition, the inorganic film 14 is not particularly limited for its thickness, and an adequate thickness may be determined depending on the performance required for the inorganic film 14 and the functional film 10 to be formed.

For example, when the functional film 10 produced is a gas barrier film (water vapor barrier film), the inorganic film 14 may be, for example, a film of silicon nitride, aluminum oxide, or silicon oxide.

When the functional film 10 produced is a protective film for a device such as organic EL display, liquid crystal display, or other display, the inorganic film 14 may be, for example, a film of silicon oxide.

When the functional film 10 produced is an optical film such as an antireflection film, a light reflecting film, or any of various filters, the inorganic film 14 may be, for example, a film comprising a material having the intended optical properties or capable of exhibiting the intended optical properties.

The present invention is very suitable for the production of a gas barrier film, because the organic film 12 has excellent surface smoothness and other favorable surface properties, and such properties of the organic film 12 enable formation of an inorganic film 14 which is compact with extremely few cracks and missing parts and which has high smoothness and good gas barrier properties.

In the present invention, after completing the formation of the inorganic film 14, the surface of the substrate B, namely, the surface of the inorganic film 14 (functional film 10) may be brought in contact with any members. In other words, in the film forming chamber 52 of the embodiment shown in FIG. 2B, a member which can be brought in contact with the surface of the substrate B may be provided downstream of the film forming means 64d. Therefore, the guide roller 70 and a guide roller 78 in the take-up chamber 54 to be described later may be common straight-type guide rollers instead of the stepped rollers.

In the present invention, the rear surface of the substrate B (the side opposite to the surface on which the organic film 12 is formed) may also be brought in contact with any members either in the atmosphere or in vacuum. Furthermore, various members which can be brought in contact with the surface of the organic film 12 such as the conveyor roller pairs may be used in the atmosphere.

In the production method of the present invention, the means used for the formation of the inorganic film 14 in the film forming chamber 52 is not limited to the 4 film forming means 64a to 64d, and the inorganic film 14 may be formed by 3 or less film forming means or 5 or more film forming means.

Furthermore, the inorganic film 14 is not limited to the one comprising a single layer, and it may comprise two or more layers which may be the same or different from each other.

The substrate Bo on which the inorganic film 14 has been formed by the film forming means 64a to 64d in the film forming chamber 52 of the inorganic film forming device 22, that is, the functional film 10 is then guided by the guide roller 70 and conveyed into the take-up chamber 54 through a slit 75a formed in a separation wall 75 for separating the film forming chamber 52 from the take-up chamber 54.

In the illustrated embodiment, the take-up chamber 54 includes the guide roller 78, the winding shaft 58 and a vacuum evacuation means 80.

The functional film 10 conveyed to the take-up chamber 54 is guided by the guide roller 78 to be conveyed to the winding shaft 58, where the functional film is wound into a roll, which is then used in the subsequent step as a roll of functional film. As in the above-described feed chamber 50, the take-up chamber 54 is also provided with the vacuum evacuation means 80 and is evacuated during film deposition to a degree of vacuum appropriate for the film forming pressure in the film forming chamber 52. As in the vacuum evacuation means 72 of the film forming chamber 52, any known means may be used for the vacuum evacuation means 80.

In the embodiment shown in FIGS. 2A and 2B, after the organic film 12 has been formed on the substrate B in the form of a long film strip in the organic film forming device 20, the substrate Bo having the organic film 12 formed on the substrate B is wound to give the substrate roll 42, which is then mounted in the inorganic film forming device 22, and the substrate Bo is fed from the substrate roll 42 to form the inorganic film 14 thereon. However, this is not the sole case of the present invention but the inorganic film 14 may be continuously formed on the substrate Bo having the organic film 12 formed on the substrate B without winding it into a roll.

Figure 5:
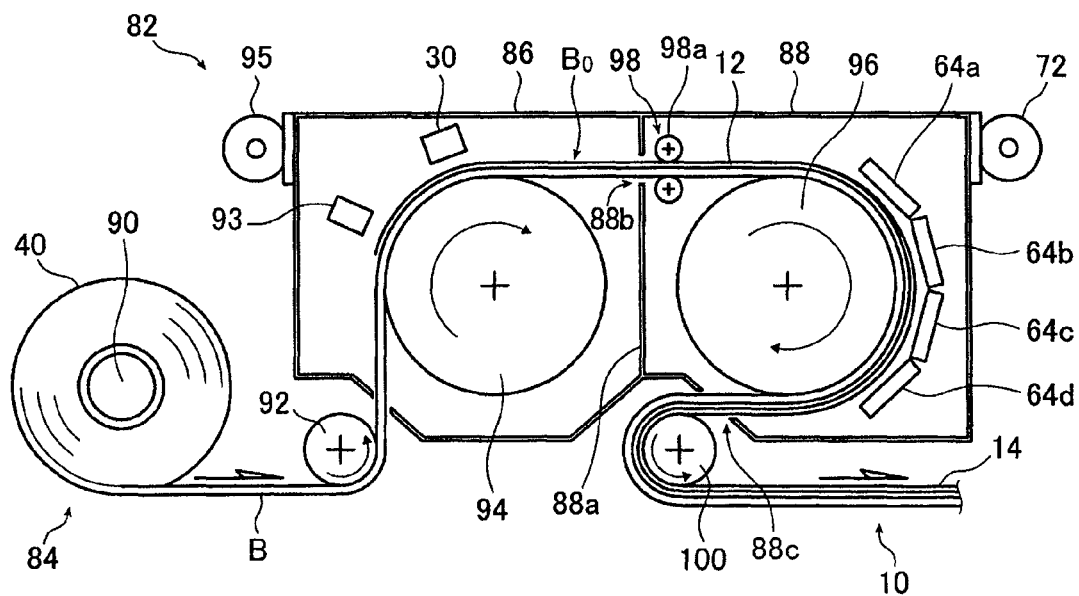
FIG. 5 is a schematic view showing another embodiment of the production device for implementing the functional film production method of the present invention.

FIG. 5 schematically shows another embodiment of the functional film production device for implementing the functional film production method of the present invention.

Since a functional film production device 82 shown in FIG. 5 has a large number of like components to those in the organic film forming device 20 and the inorganic film forming device 22, like elements are denoted by the same reference numerals and the following description mainly focuses on the distinctive portions.

As in the embodiment described above, the functional film production device 82 (hereinafter referred to as the "production device 82") shown in FIG. 5 produces a functional film 10 by forming an organic film 12 on the surface of a substrate B in the form of a long film strip (starting film material) and forming an inorganic film 14 on the organic film 12 by vacuum deposition.

The production device 82 is also a device in which film formation is carried out by the above-described roll to roll system. In this device, the substrate B wound into a roll is fed from a substrate roll 40 and conveyed in its longitudinal direction while the organic film 12 and the inorganic film 14 are formed on the substrate B, and the functional film 10 having both the films formed thereon is then wound into a roll. The production device 82 includes a substrate feed section 84, an organic film forming chamber 86, an inorganic film forming chamber 88 and a take-up section (not shown) in which the produced functional film 10 is wound into a roll.

In the production device 82, the substrate roll 40 having the substrate B in the form of a long film strip as described above is mounted on a rotary shaft 90 of the substrate feed section 84.

Once the substrate roll 40 is mounted on the rotary shaft 90, the substrate B is conveyed along a predetermined pathway along which the substrate B travels from the substrate feed section 84 through the organic film forming chamber 86 and the inorganic film forming chamber 88 to a winding shaft (not shown) of the take-up section. In the production device 82, the feed of the substrate B from the substrate roll 40 and the winding of the functional film 10 on the winding shaft are carried out in synchronism so that the continuous formation of the organic film 12 on the substrate B and the subsequent continuous formation of the inorganic film 14 are carried out while the substrate B in the form of a long film strip is conveyed in its longitudinal direction along the predetermined pathway.

In the substrate feed section 84, the rotary shaft 90 is rotated by a drive source (not shown) in a counterclockwise direction in FIG. 5 so that the substrate B is fed from the substrate roll 40 and guided by a guide roller 92 along the predetermined pathway to be conveyed to the organic film forming chamber 86.

In addition to the illustrated members, the substrate feed section 84 may also have various members for conveying the substrate B along the predetermined pathway, as exemplified by a conveyor roller pair and a guide member.

The organic film forming chamber 86 forms the organic film 12 containing a polymer as its main component on the surface of the substrate B by the above-described flash evaporation. In the illustrated embodiment, the organic film forming chamber 86 includes a drum 94, a monomer nozzle 93, and a UV irradiator 30 which is configured in the same manner as in the above-described organic film forming device 20. The organic film forming chamber 86 is a vacuum chamber and is substantially airtightly separated from the neighboring space and is provided with a vacuum evacuation means 95 of the same type as the vacuum evacuation means 72.

The drum 94 is a cylindrical member which rotates around the central axis in a direction indicated by an arrow in FIG. 5 as in the above-described drum 62. The substrate B conveyed from the substrate feed section 84 is wrapped around a predetermined region of the peripheral surface of the drum 94 and conveyed along the predetermined pathway to the inorganic film forming chamber 88 to be described later while being supported and guided by the drum 94.

During the film deposition, the organic film forming chamber 86 is evacuated to a predetermined pressure (degree of vacuum) by the vacuum evacuation means 95. A coating composition containing a monomer constituting the organic film 12 is applied through the monomer nozzle 93 onto the surface of the substrate B to form a coating by flash evaporation, and the UV irradiator 30 irradiates the coating with UV light to polymerize the monomer to thereby form the organic film 12.

A substrate Bo having the organic film 12 formed on the substrate B in the organic film forming chamber 86 is then conveyed to the inorganic film forming chamber 88. Since the organic film forming chamber 86 is a vacuum device where flash evaporation is carried out, use is made of a member such as the above-described stepped roll which contacts the ends of the thus formed organic film 12 or other portions where the organic film 12 does not exhibit its functions.

The inorganic film forming chamber 88 deposits (forms) the inorganic film 14 on the surface of the substrate Bo (i.e., on the surface of the organic film 12) by vacuum deposition and includes a drum 96, film forming means 64a, 64b, 64c and 64d, and a vacuum evacuation means 72. When sputtering or plasma CVD is carried out for film deposition in the inorganic film forming chamber 88, an RF power supply is also provided in the inorganic film forming chamber 88.

The substrate Bo is conveyed to the inorganic film forming chamber 88 through a slit 88b formed in a separation wall 88a between the organic film forming chamber 86 and the inorganic film forming chamber 88.

The inorganic film forming chamber 88 is a vacuum chamber and is substantially airtightly separated from the neighboring space. Therefore, the slit 88b should have the minimum size which allows the substrate Bo to pass through the slit 88b without contacting the slit 88b. The same holds true for an inlet of the organic film forming chamber 86 for the substrate B and an outlet 88c through which the substrate B having the inorganic film 14 formed thereon is discharged from the inorganic film forming chamber 88. In addition, as in the above-described inorganic film forming device 22, a subchamber through which the substrate B passes may be provided between the organic film forming chamber 86 and the inorganic film forming chamber 88 and/or between the inorganic film forming chamber 88 and exterior space (take-up section) in order to maintain the inorganic film forming chamber 88 at a predetermined degree of vacuum.

The substrate Bo conveyed from the organic film forming chamber 86 is nipped and conveyed by a conveyor roller pair 98 to be further conveyed along the predetermined pathway and wrapped around the drum 96.

In vacuum, the organic film 12 contacts an upper roller 98a of the conveyor roller pair 98 in FIG. 5. Therefore, at least the upper roller 98a of the conveyor roller pair 98 that contacts the organic film 12 is a roller of the same type as the guide roller 68 which is a stepped roller contacting the organic film 12 only at the ends of the substrate Bo. As in the embodiment described above, the performance or properties in the necessary regions of the organic film 12 are prevented from deteriorating to enable a high quality functional film 10 to be produced in a consistent manner.

A lower roller of the conveyor roller pair 98 that contacts the rear surface of the substrate Bo may be a stepped roller of the same type as the roller 98a or be a common straight-type roller that contacts the whole area of the rear surface of the substrate Bo in its width direction.

As in the organic film forming chamber 86, the drum 96 of the inorganic film forming chamber 88 is also a cylindrical member which rotates around the central axis in a direction indicated by an arrow in FIG. 5.

The substrate Bo conveyed from the organic film forming chamber 86 is wrapped around a predetermined region of the peripheral surface of the drum 96 and is conveyed along the predetermined pathway while being supported and guided by the drum 96, and the inorganic film 14 is formed on the surface of the substrate Bo (on the organic film 12) by vacuum deposition from the film forming means 64a to 64d as in the film forming chamber 52 described above. When sputtering or plasma CVD is carried out for film deposition in the inorganic film forming chamber 88, the drum 96 may be grounded so that it also functions as a counter electrode. Alternatively, the drum 96 may be connected to the RF power supply.

In the production device 82, the substrate Bo having the inorganic film 14 formed thereon by the film forming means 64a to 64d of the inorganic film forming chamber 88, namely, the functional film 10 is discharged from the inorganic film forming chamber 88 through the outlet 88c and guided by a guide roller 100 to be conveyed to the take-up chamber (not shown), where the functional film is wound on the winding shaft into a roll, which is then used in the subsequent step as a roll of functional film.

In the embodiment described above, a stepped roller that contacts the organic film 12 only at the ends of the substrate Bo (i.e., the portions where the organic film 12 does not exhibit its functions) is used for the conveyor means that contacts the organic film 12 in vacuum. However, this is not the sole case of the present invention and various conveyor means may be used as long as the conveyor means used contacts the organic film 12 only at its ends.

In the case where, in addition to the conveyor means, any other member such as a means for holding the substrate Bo at a predetermined position contacts the organic film 12 in a vacuum device such as a vacuum chamber or a subchamber before the inorganic film 14 is formed thereon, such member should be brought in contact with the ends of the substrate Bo or other portions where the organic film 12 does not exhibit its functions.

In an example, in the case where a conveyor means contacting the organic film 12 in vacuum prior to forming the inorganic film 14 is necessary, both ends of the substrate Bo may be clipped with clips (clipping means) to hold the substrate Bo and further moved in the direction of conveyance of the substrate Bo to convey the substrate Bo with the conveyor means contacting the organic film 12 only at the ends of the substrate Bo.

In an alternative case, perforations (sprocket holes) are formed at both ends of the substrate B as in a photographic negative film. In the case where a conveyor means contacting the organic film 12 in vacuum prior to forming the inorganic film 14 is necessary, a sprocket gear having a sprocket engaging with the perforations may be used to convey the substrate Bo with the conveyor means contacting the organic film 12 only at the ends of the substrate Bo.

In the production method of the present invention, two or more of the stepped roller, the clips, the combination of the perforations with the sprocket may be used as the conveyor means that contacts the organic film 12 in vacuum prior to forming the inorganic film 14.

While the method for producing a functional film according to the present invention has been described above in detail, the present invention is by no means limited to the foregoing embodiments and it should be understood that various improvements and modifications may of course be made without departing from the scope and spirit of the invention.

EXAMPLES

Next, the present invention is described in further detail by referring to the Examples.

Example 1

A mixture solution containing a mixture of 15 g of a polymerizable monomer BEPGA available from Kyoeisha Chemical Co., Ltd. and 5 g of a polymerizable monomer V-3PA available from Osaka Organic Chemical Industry Ltd., 1.5 g of a UV polymerization initiator (trade name: Esacure KTO-46 available from Lamberti S.p.A.), and 190 g of 2-butanone was prepared, and used as a coating composition for the formation of the organic film 12.

A long PET film (polyethylene terephthalate film) with a width of 300 mm was prepared for the substrate B.

The organic film forming device 20 shown in FIG. 2A was used to apply the prepared coating composition on the surface of the substrate B, dry the applied coating composition and irradiate the coating with UV light to polymerize the monomer mixture, thereby forming the organic film 12.

A wire bar was used for the coater means 26 to control the application so that the coating composition applied has a thickness of 5 µm.

The dryer means 28 used for drying the coating composition was a dryer means by convective heat transfer.

In addition, the UV irradiator 30 used was a UV irradiator employing a high pressure mercury vapor lamp. The amount of light from the high pressure mercury vapor lamp was controlled so that UV light was irradiated to an accumulated irradiation amount of about 2 J/cm$^2$. The area including the high pressure mercury vapor lamp within which UV light was to be irradiated onto the substrate B was surrounded by a chamber and the oxygen concentration within the chamber was adjusted to 0.1% by nitrogen flushing.

The resulting organic film 12 had a thickness of 500 nm±50 nm.

Then, the substrate roll 42 was mounted in the inorganic film forming device 22 shown in FIG. 2B and an aluminum oxide film with a thickness of 40 nm was formed as the inorganic film 14 on the surface of the substrate Bo having the organic film 12 formed on the substrate B, thereby producing a gas barrier film.

Sputtering was carried out in the film forming chamber 52. Use was made of aluminium as a target, argon as a discharge gas, and oxygen as a reactive gas, respectively. The pressure in film formation was set to 0.1 Pa. The vacuum evacuation means 61 and 80 were driven in a controlled manner so that the feed chamber 50 and the take-up chamber 54 each had an internal pressure of 0.1 Pa.

Stepped rollers that convey the substrate Bo (guide the substrate Bo along the pathway) while contacting only 20 mm-portions at both ends of the substrate Bo were used for the guide roller 60 of the feed chamber 50 and the guide roller 68 of the film forming chamber 52.

Comparative Example 1

A gas barrier film was produced by repeating the procedure of Example 1 except that the guide roller 60 of the feed chamber 50 and the guide roller 68 of the film forming chamber 52 were not the stepped rollers but common straight-type rollers that contacted the whole area in the width direction of the substrate Bo.

The surface of the thus produced gas barrier film 10 (surface of the inorganic film 14) was observed by an electron microscope and was found to have cracks and missing parts.

The gas barrier films produced in Example 1 and Comparative Example 1 were evaluated for their water vapor transmission rate in 20 mm-portions from both the edges of the films at a temperature of 40° C. and a relative humidity of 90% by using a water vapor transmission rate tester (PERMATRAN-W3/31 available from Mocon, Inc.). Since the detection limit in the method of measuring the water vapor transmission rate is 1×10$^{-2}$ g/m$^2$/day, the sample in which the water vapor transmission rate according to this measurement method was below the detection limit was then subjected to measurement of the water vapor transmission rate at a temperature of 40° C. and a relative humidity of 90% according to the method described in the following reference:

G. NISATO, P. C. P. BOUTEN, P. J. SLIKKERVEER et al. SID Conference Record of the International Display Research Conference, pages 1435-1438.

As a result, the water vapor transmission rate in Example 1 was 1.1×10$^{-3}$ g/m$^2$/day whereas the water vapor transmission rate in Comparative Example 1 was 3.4×10$^{-2}$ g/m$^2$/day.

The above results clearly show the beneficial effects of the present invention.

What is claimed is:

1. A method for producing a functional film, comprising the steps of:

forming an organic film including a polymer accounting for at least 80% by weight of the total weight of the organic film, the polymer being produced by polymerizing an acrylate monomer and/or methacrylate monomer, on a surface of a substrate; and forming an inorganic film by vacuum deposition on a surface of the organic film to produce the functional film, wherein, prior to forming the inorganic film, a member contacts the surface of the organic film in a vacuum chamber at end portions of said substrate to be cut off or removed later or unnecessary to serve as a functional film and transports the substrate in a linear direction.

2. The functional film production method according to claim 1, wherein the inorganic film formed has gas barrier properties.

3. The functional film production method according to claim 1, wherein the member contacting the organic film in the vacuum chamber comprises a stepped roller.

4. The functional film production method according to claim 3, wherein a nip roller for nipping the substrate with the stepped roller is further used.

5. The functional film production method according to claim 1, wherein the member contacting the organic film in the vacuum chamber comprises clips with which ends of the substrate in a direction perpendicular to a direction in which the substrate is conveyed are clipped to convey the substrate.

6. The functional film production method according to claim 1, wherein perforations are formed at both ends of the substrate in a direction perpendicular to a direction in which the substrate is conveyed and the member contacting the organic film in the vacuum chamber comprises a sprocket engaging with the perforations.

7. The functional film production method according to claim 1, wherein the polymer comprises a constitutional unit represented by the general formula (I) where m is 2 and a constitutional unit represented by the general formula (I) where m is at least 3,

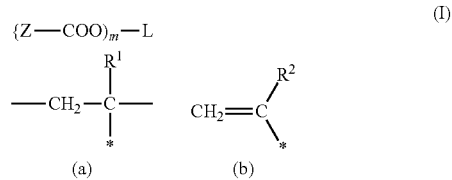

where Z is represented by the above functional group (a) or (b); $R^1$ and $R^2$ each independently represent hydrogen atom or methyl group; * indicates the site to which carbonyl group of said general formula (I) is bonded; and L represents an m-valent linking group, and where at least one Z is represented by the functional group (a), while Z groups whose number is "m" may be the same or different from each other.

* * * * *